US012045406B2

(12) United States Patent
Wu et al.

(10) Patent No.: US 12,045,406 B2
(45) Date of Patent: Jul. 23, 2024

(54) ELECTRONIC DEVICE

(71) Applicant: InnoLux Corporation, Miao-Li County (TW)

(72) Inventors: Yuan-Lin Wu, Miao-Li County (TW); Yu-Chia Huang, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 18/096,005

(22) Filed: Jan. 11, 2023

(65) Prior Publication Data
US 2023/0266835 A1    Aug. 24, 2023

(30) Foreign Application Priority Data
Feb. 22, 2022   (CN) .......................... 202210162107.0

(51) Int. Cl.
*G06F 3/041*   (2006.01)
*H05K 1/02*    (2006.01)

(52) U.S. Cl.
CPC .......... *G06F 3/041* (2013.01); *H05K 1/0283* (2013.01); *G06F 2203/04102* (2013.01); *G06F 2203/04103* (2013.01); *H05K 2201/10151* (2013.01)

(58) Field of Classification Search
CPC .......... G06F 3/041; G06F 2203/04102; G06F 2203/04103; H05K 1/0283; H05K 2201/10151
See application file for complete search history.

(56) References Cited

U.S. PATENT DOCUMENTS

| | | | |
|---|---|---|---|
| 2016/0202831 A1* | 7/2016 | Kim | G06F 3/0443 345/173 |
| 2017/0090517 A1* | 3/2017 | Park | H05K 3/12 |
| 2018/0300006 A1 | 10/2018 | Lim | |
| 2019/0107911 A1* | 4/2019 | Zhai | H10K 59/40 |
| 2021/0134191 A1 | 5/2021 | Jung | |
| 2022/0346239 A1* | 10/2022 | Pi | H05K 1/189 |

FOREIGN PATENT DOCUMENTS

CN           108459769 A      8/2018

* cited by examiner

*Primary Examiner* — Michael J Jansen, II
*Assistant Examiner* — Sosina Abebe
(74) *Attorney, Agent, or Firm* — Winston Hsu

(57) ABSTRACT

An electronic device including a cover and a stretchable sensing unit is provided by the present disclosure. The cover has a curved surface, the curved surface has a first region with a first Gaussian curvature, and the first Gaussian curvature is not equal to zero. The stretchable sensing unit is attached to the cover, wherein the stretchable sensing unit includes a stretchable substrate and a first sensing element disposed on the stretchable substrate. The first sensing element is disposed between the first region of the curved surface and the stretchable substrate.

7 Claims, 15 Drawing Sheets

ELECTRONIC DEVICE

BACKGROUND OF THE DISCLOSURE

1. Field of the Disclosure

The present disclosure relates to an electronic device, and more particularly relates to a stretchable electronic device.

2. Description of the Prior Art

In order to increase the applications of sensors, the sensors can be attached to a non-planar surface, such as a curved surface. Therefore, the sensors may serve as vehicle sensors or wearing sensors. However, when a sensor is attached to a curved surface, folds of other problems of the sensor may occur and affect the sensitivity of the sensor. Therefore, to manufacture a sensor that can be attached to a curved surface is still an important issue in the related field.

SUMMARY OF THE DISCLOSURE

In some embodiments, an electronic device is provided by the present disclosure. The electronic device includes a cover and a stretchable sensing unit. The cover has a curved surface, the curved surface has a first region with a first Gaussian curvature, and the first Gaussian curvature is not equal to zero. The stretchable sensing unit is attached to the cover, wherein the stretchable sensing unit includes a stretchable substrate and a first sensing element disposed on the stretchable substrate. The first sensing element is disposed between the first region of the curved surface and the stretchable substrate.

In some embodiments, a method for manufacturing an electronic device is provided by the present disclosure. The manufacturing method includes providing a stretchable sensing unit, stretching out the stretchable sensing unit, providing a cover which has a curved surface with a Gaussian curvature not equal to zero, and attaching the stretchable sensing unit to the cover.

These and other objectives of the present disclosure will no doubt become obvious to those of ordinary skill in the art after reading the following detailed description of the embodiment that is illustrated in the various figures and drawings.

DETAILED DESCRIPTION

Figure 1:
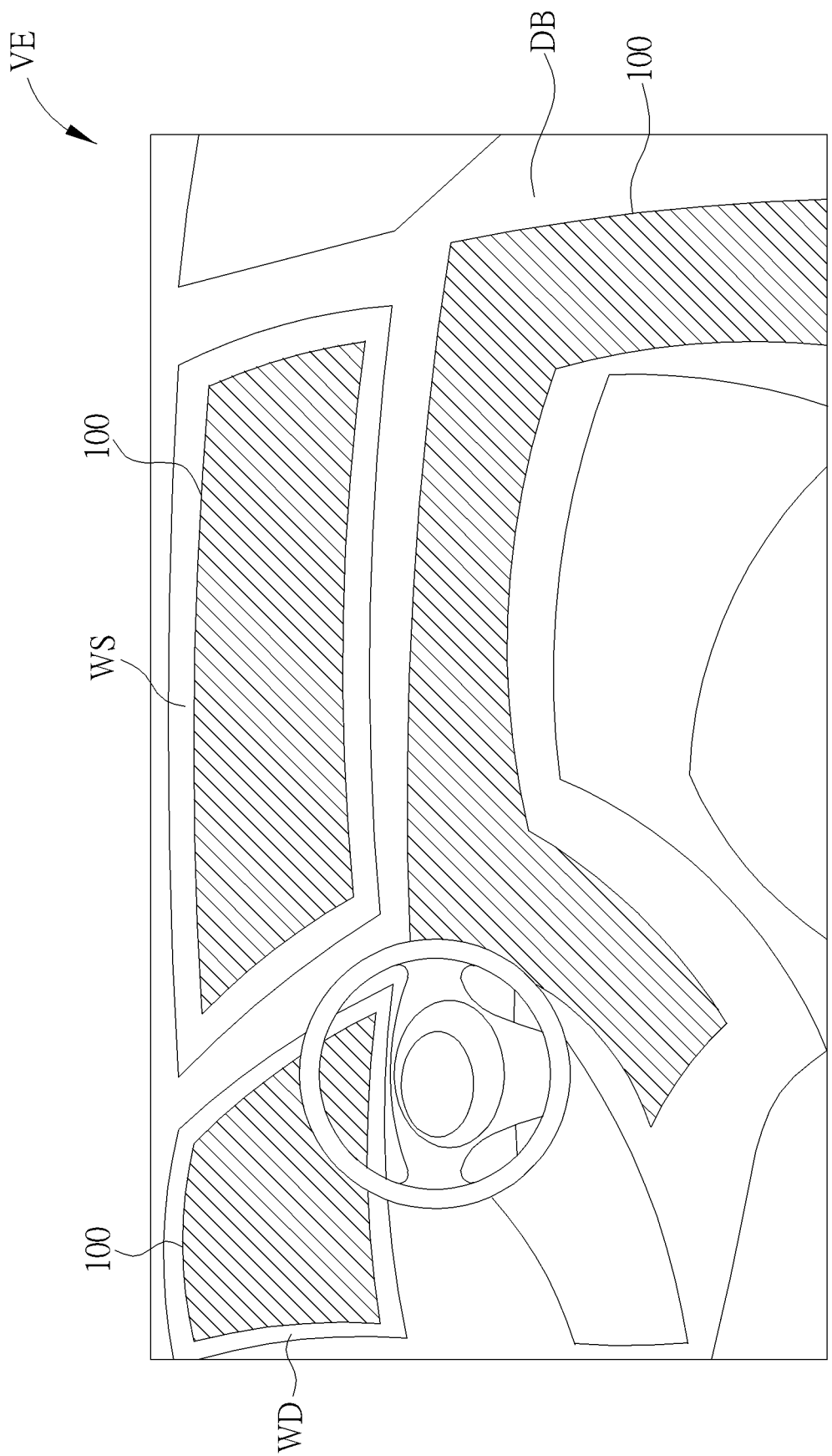
FIG. 1 schematically illustrates an application of an electronic device according to a first embodiment of the present disclosure.

The present disclosure may be understood by reference to the following detailed description, taken in conjunction with the drawings as described below. It is noted that, for purposes of illustrative clarity and being easily understood by the readers, various drawings of this disclosure show a portion of the electronic device, and certain elements in various drawings may not be drawn to scale. In addition, the number and dimension of each element shown in drawings are only illustrative and are not intended to limit the scope of the present disclosure.

Certain terms are used throughout the description and following claims to refer to particular elements. As one skilled in the art will understand, electronic equipment manufacturers may refer to an element by different names. This document does not intend to distinguish between elements that differ in name but not function.

In the following description and in the claims, the terms "include", "comprise" and "have" are used in an open-ended fashion, and thus should be interpreted to mean "include, but not limited to . . . ".

It will be understood that when an element or layer is referred to as being "disposed on" or "connected to" another element or layer, it can be directly on or directly connected to the other element or layer, or intervening elements or layers may be presented (indirectly). In contrast, when an element is referred to as being "directly on" or "directly connected to" another element or layer, there are no intervening elements or layers presented. When an element or a layer is referred to as being "electrically connected" to another element or layer, it can be a direct electrical connection or an indirect electrical connection. The electrical connection or coupling described in the present disclosure may refer to a direct connection or an indirect connection. In the case of a direct connection, the ends of the elements on two circuits are directly connected or connected to each other by a conductor segment. In the case of an indirect connection, switches, diodes, capacitors, inductors, resistors, other suitable elements or combinations of the above elements may be included between the ends of the elements on two circuits, but not limited thereto.

Although terms such as first, second, third, etc., may be used to describe diverse constituent elements, such constituent elements are not limited by the terms. The terms are used only to discriminate a constituent element from other constituent elements in the specification. The claims may not use the same terms, but instead may use the terms first, second, third, etc. with respect to the order in which an element is claimed. Accordingly, in the following description, a first constituent element may be a second constituent element in a claim.

In addition, any two values or directions used for comparison may have certain errors. In addition, the terms "equal to", "equal", "the same", "approximately" or "substantially" are generally interpreted as being within ±20%, ±10%, ±5%, ±3%, ±2%, ±1%, or ±0.5% of the given value.

If a first direction is said to be perpendicular to a second direction, the included angle between the first direction and the second direction may be located between 80 to 100 degrees. If a first direction is said to be parallel to a second direction, the included angle between the first direction and the second direction may be located between 0 to 10 degrees.

Unless it is additionally defined, all terms (including technical and scientific terms) used herein have the same meaning as commonly understood by those ordinary skilled in the art. It can be understood that these terms that are defined in commonly used dictionaries should be interpreted as having meanings consistent with the relevant art and the background or content of the present disclosure, and should not be interpreted in an idealized or overly formal manner, unless it is specifically defined in the embodiments of the present disclosure.

In the present disclosure, the electronic device may include a display device, a sensing device, a back-light device, an antenna device or a tiled device, but not limited thereto. The electronic device may be a foldable electronic device, a flexible electronic device or a stretchable electronic device. For example, the electronic device of the present disclosure may include a sensing device. The sensing device may for example include a touch sensor, a stylus sensor, an antenna, a fingerprint sensor, other suitable sensors or combinations of the above-mentioned sensors, but the present disclosure is not limited thereto.

Figure 2:
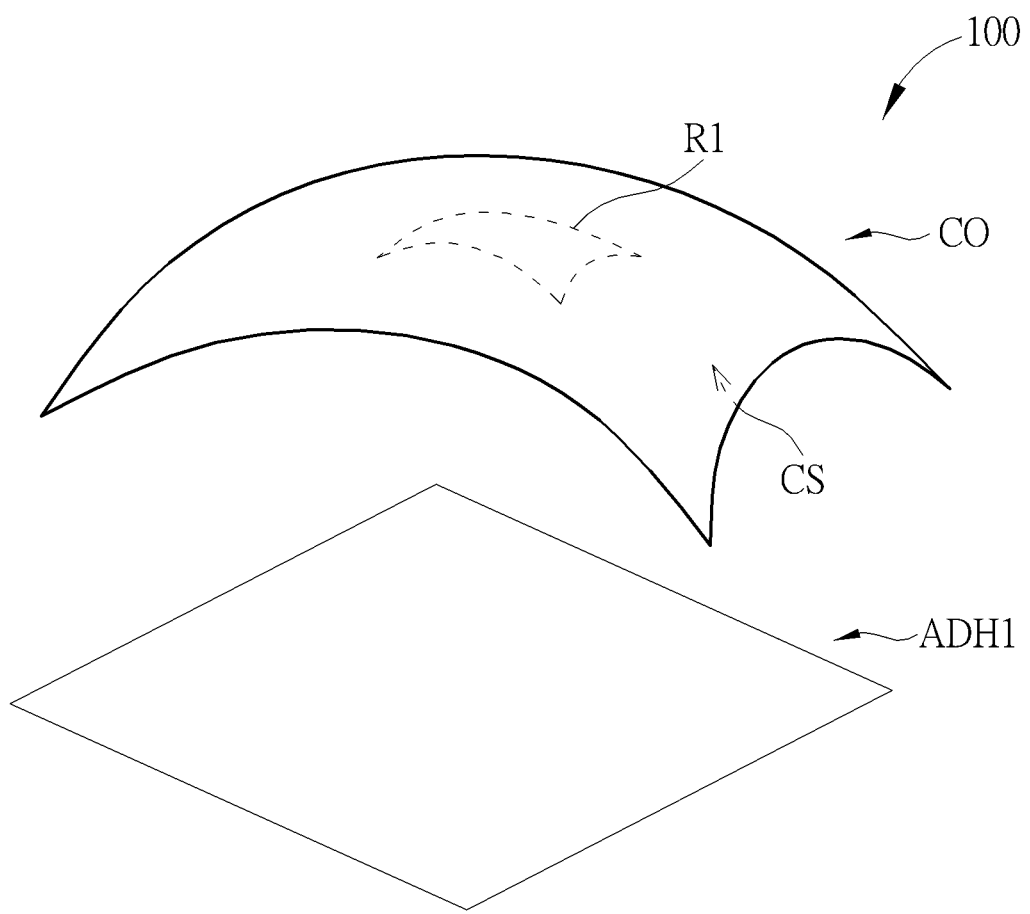
FIG. 2 schematically illustrates an exploded view of the electronic device according to the first embodiment of the present disclosure.
Figure 2:
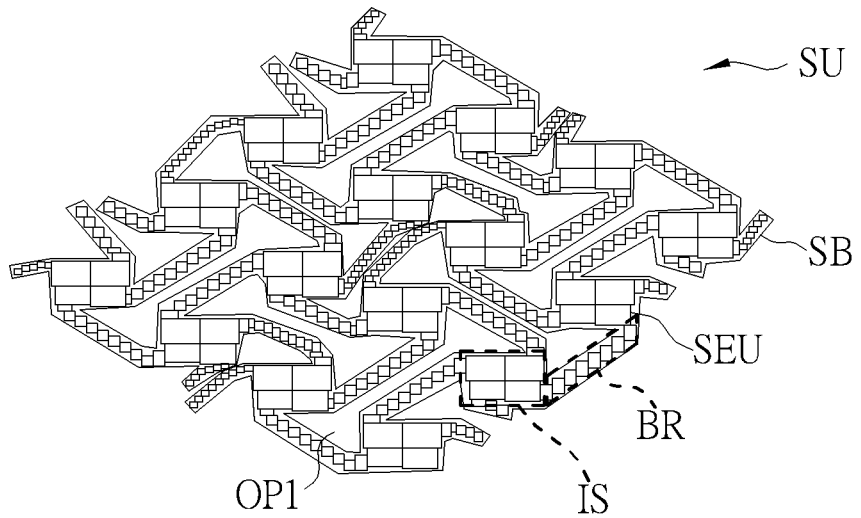
Figure 3:
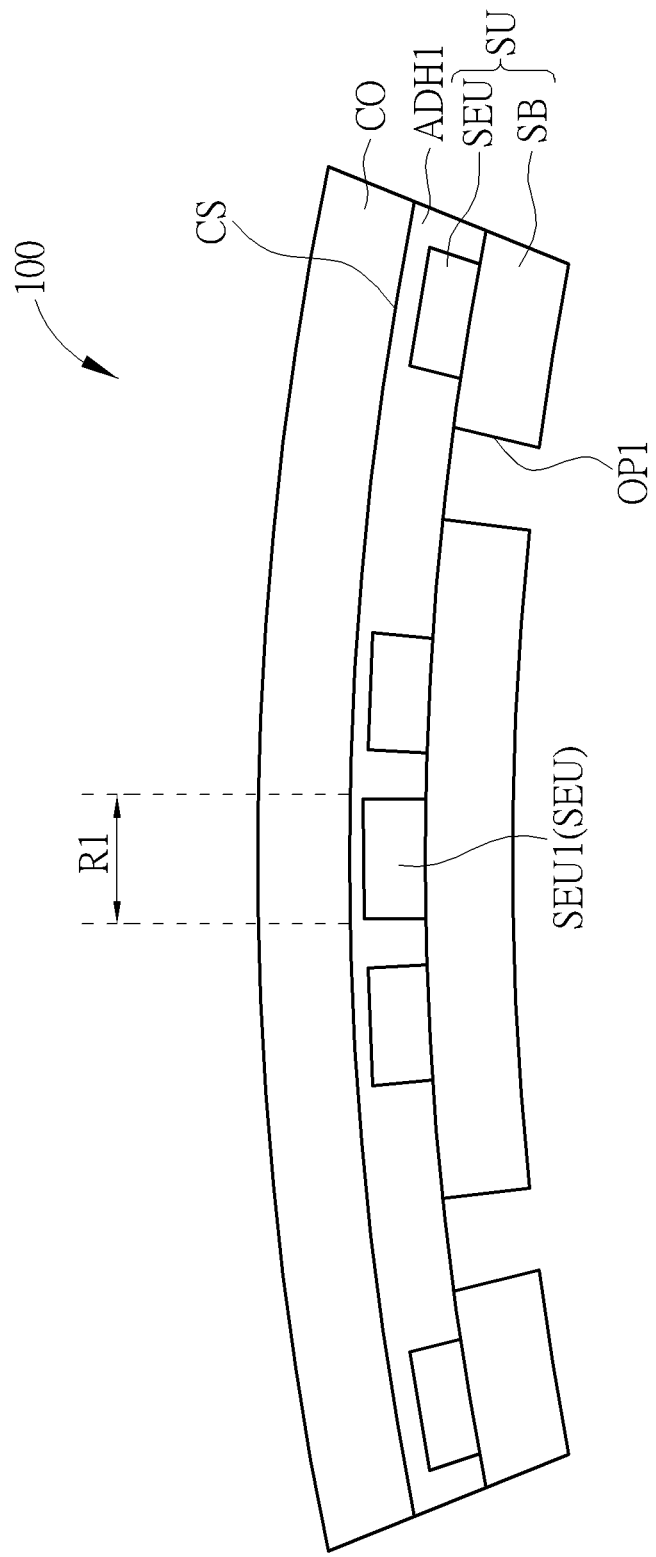
FIG. 3 schematically illustrates a cross-sectional view of the electronic device according to the first embodiment of the present disclosure.

Referring to FIG. 1, FIG. 2 and FIG. 3, FIG. 1 schematically illustrates an application of an electronic device according to a first embodiment of the present disclosure, FIG. 2 schematically illustrates an exploded view of the electronic device according to the first embodiment of the present disclosure, and FIG. 3 schematically illustrates a cross-sectional view of the electronic device according to the first embodiment of the present disclosure. According to the present embodiment, as shown in FIG. 2 and FIG. 3, the electronic device 100 may include a cover CO and a stretchable sensing unit SU, wherein the stretchable sensing unit SU may be attached to the cover CO through a first adhesive layer ADH1, and the first adhesive layer ADH1 may be disposed between the cover CO and the stretchable sensing unit SU to fix the stretchable sensing unit SU. For example, a glue material of the first adhesive layer ADH1 may be disposed on the stretchable sensing unit SU at first, and the stretchable sensing unit SU may be attached to the cover CO through the glue material of the first adhesive layer ADH1, but not limited thereto. The material of the cover CO may for example include glass, plastic, sapphire substrate, other suitable materials or combinations of the above-mentioned materials, but not limited thereto. It should be noted that although the cover CO is shown as a single layer in FIG. 2 and FIG. 3, the present disclosure is not limited thereto. In some embodiments, the cover CO may include a multi-layer structure. The first adhesive layer ADH1 of the present embodiment may include an optical clear adhesive, an optical clear resin, other suitable adhesive or a combination of the above-mentioned materials. It should be noted that the elements and/or the layers included in the electronic device 100 is not limited to what is shown in FIG. 2 and FIG. 3, and any suitable element(s) and/or layer(s) may be included in the electronic device 100 according to the demands of the design.

As shown in FIG. 2 and FIG. 3, the stretchable sensing unit SU may include a stretchable substrate SB and a plurality of sensing elements SEU disposed on the stretchable substrate SB, but not limited thereto. The sensing element SEU may for example be defined as the minimum sensing unit in the electronic device 100 or the minimum unit having sensing function. For example, the sensing process may be performed through a single sensing element SEU independently. In addition, according to the types or usage of the electronic device 100, the sensing elements SEU may include various types of sensing units. Specifically, when the electronic device 100 includes a touch device, the stretchable sensing unit SU may include a plurality of touch electrodes, and the sensing element SEU may for example be one of the touch electrodes; and when the electronic device 100 includes an antenna device, the stretchable sensing unit SU may include a plurality of antenna elements, and the sensing element SEU may for example be one of the antenna elements, but not limited thereto. The stretchable sensing unit SU may include various types of sensing elements SEU or sensing elements SEU with different functions simultaneously, or the stretchable sensing unit SU may only include the sensing elements SEU of a single type. It should be noted that although it is not shown in FIG. 2 and FIG. 3, the stretchable sensing unit SU may further include a circuit layer, wherein the circuit layer may include elements such as connecting pads, wires, driving circuits, and the like, but not limited thereto. The driving circuits (not shown) in the circuit layer may be electrically connected to the sensing elements SEU to drive or control the sensing elements SEU. As shown in FIG. 2, the sensing elements SEU of the present embodiment may for example include metal mesh, but not limited thereto. In some embodiments, the sensing elements SEU may be disposed on the stretchable substrate SB in other ways, according to the demands of the design of the electronic device 100. The material of the sensing elements SEU may for example include aluminum, titanium, copper, carbon nanotube, metallic nanoparticle, metallic nanowire, conductive polymer, other suitable materials or combinations of the above-mentioned materials.

The stretchable substrate SB of the present embodiment may be formed by patterning a substrate, wherein the stretchable substrate SB formed after patterning may be stretched in any direction, and the sensing elements SEU may be disposed on the patterned stretchable substrate SB, but not limited thereto. The material of the stretchable substrate SB may include polyimide (PI), polycarbonate (PC), polyethylene terephthalate (PET), other suitable materials or combinations of the above-mentioned materials. As shown in FIG. 2, the stretchable substrate SB of the present embodiment may for example include a plurality of island portions IS, a plurality of bridge portions BR and a plurality of openings OP1 after it is patterned, wherein one of the bridge portions BR may connect at least two island portions IS, and the opening OP1 may be located between the island portion IS and the bridge portion BR. Specifically, an island portion IS may be connected to at least one bridge portion BR, thereby being connected to another island portion IS through the at least one bridge portion BR, but not limited thereto. It should be noted that the pattern of the stretchable substrate SB shown in FIG. 2 is just exemplary, and the present disclosure is not limited thereto. In some embodiment, the stretchable substrate SB may include other suitable patterns according to the demands of the design of the electronic device 100. According to the present embodiment, the island portions IS of the stretchable substrate SB may be used for disposition of main working units of the electronic device 100, or in other words, the main working units of the electronic device 100 may be disposed on the island portions IS. The main working units of the electronic device 100 may be determined according to the structure of the electronic device 100. For example, when the electronic device 100 includes a display device, the main working units may include light emitting units and optionally include switch elements or driving elements; and when the electronic device 100 includes an antenna device, the main working units may include antenna elements, but not limited thereto. The sensing elements SEU may be disposed on the island portions IS of the stretchable substrate SB in the present embodiment, but not limited thereto. It should be noted that although the stretchable substrate SB is shown as a single layer in FIG. 2 and FIG. 3, the present disclosure is not limited thereto. In some embodiments, the stretchable substrate SB may include a multi-layer structure.

According to the present embodiment, the cover CO of the electronic device 100 includes a curved surface CS, wherein the Gaussian curvature of the curved surface CS is not equal to zero. For example, the cover CO may include a spherical surface, but not limited thereto. It should be noted that "the Gaussian curvature of the curved surface is not equal to zero" may include the condition that the Gaussian curvature of at least a portion of the curved surface CS is not equal to zero. For example, as shown in FIG. 2 and FIG. 3, the curved surface CS of the cover CO of the present embodiment may at least include a first region R1, wherein the Gaussian curvature of the first region R1 is not equal to zero, but not limited thereto. In some embodiments, the curved surface CS may further include other regions with Gaussian curvatures not equal to zero in addition to the first region R1. In some embodiments, the Gaussian curvature of any position on the curved surface CS may not be equal to zero. The curved surface CS may for example be defined as the surface (or the inner surface) of the cover CO facing the stretchable sensing unit SU, but not limited thereto. In some embodiments, the curved surface CS may be the outer surface of the cover CO or the surface of the cover CO away from the stretchable sensing unit SU.

Since the cover CO includes the curved surface CS with a Gaussian curvature not equal to zero, the stretchable sensing unit SU may be attached to a surface with a Gaussian curvature not equal to zero. That is, the sensing elements SEU of the stretchable sensing unit SU may be attached to a surface with a Gaussian curvature not equal to zero. In addition, as shown in FIG. 3, the stretchable sensing unit SU may be attached to the cover CO in the way that the sensing elements SEU face the cover CO, and the sensing elements SEU may be located between the cover CO and the stretchable substrate SB. For example, as shown in FIG. 3, after the stretchable sensing unit SU is attached to the cover CO and form the electronic device 100, the stretchable sensing unit SU may include a first sensing element SEU1 corresponding to the first region R1 of the cover CO with a Gaussian curvature not equal to zero, wherein the first sensing element SEU1 may be disposed between the first region R1 of the curved surface CS of the cover CO and the stretchable substrate SB, but not limited thereto. In some embodiments, the stretchable sensing unit SU may include a plurality of sensing elements SEU disposed corresponding to a surface with a Gaussian curvature not equal to zero. It should be noted that although the first adhesive layer ADH1 and the stretchable sensing unit SU are shown as a flat layer in FIG. 2, it is just exemplary. The first adhesive layer ADH1 and the stretchable sensing unit SU may for example be disposed conformally with the curved surface CS of the cover CO in the electronic device 100, which is shown in FIG. 3.

According to the present embodiment, to determine whether the Gaussian curvature of a region on the surface of the cover CO is not 0, three points in a sensing element SEU attached to the region may be taken to form a triangle, and determine whether the sum of the interior angles of the triangle is 180 degrees or not. When the sum of the interior angles of the triangle is not equal to 180 degrees, the Gaussian curvature of the region may not be equal to zero. In some embodiments, the model of the electronic device 100 may be built through scanning devices combined with software (such as Geomagic Design X, but not limited thereto), thereby determining whether the Gaussian curvature of a region on the surface of the cover CO is zero, but not limited thereto.

Since the stretchable sensing unit SU of the electronic device 100 may be attached to the curved surface CS with a Gaussian curvature not equal to zero in the present embodiment, the electronic device 100 may be applied to various structures or devices having a surface with a Gaussian curvature not equal to zero. FIG. 1 schematically shows an application of the electronic device 100. In detail, FIG. 1 shows an internal structure of a vehicle VE, wherein the vehicle VE may include a window WD, a windshield WS and a dashboard DB. The window WD, the windshield WS and the dashboard DB may include a glass with a curved surface, wherein the glass with the curved surface may include a surface with a Gaussian curvature not equal to zero. For example, the window WD, the windshield WS and the dashboard DB may include glass with spherical surface, but not limited thereto. According to the present embodiment, the electronic device 100 may be applied to the window WD, the windshield WS and/or the dashboard DB of the vehicle VE to provide the sensing function. When the electronic device 100 is applied to the window WD, the cover CO may serve as the glass of the window WD, and the stretchable sensing unit SU may be attached to the glass of the window WD, thereby providing the window WD having sensing function, but not limited thereto. Similarly, when the electronic device 100 is applied to the windshield WS and/or the dashboard DB, the cover CO may serve as the glasses of the windshield WS and/or the dashboard DB, and the stretchable sensing unit SU may be attached to the glasses of the windshield WS and/or the dashboard DB, thereby providing the windshield WS and/or the dashboard DB having sensing function. It should be noted that the application of the electronic device 100 shown in FIG. 1 is just exemplary, and the present disclosure is not limited thereto. The electronic device 100 may have other applications according to the design of the product. For example, the electronic device 100 may serve as a wearing sensing device, but not limited thereto.

Figure 4:
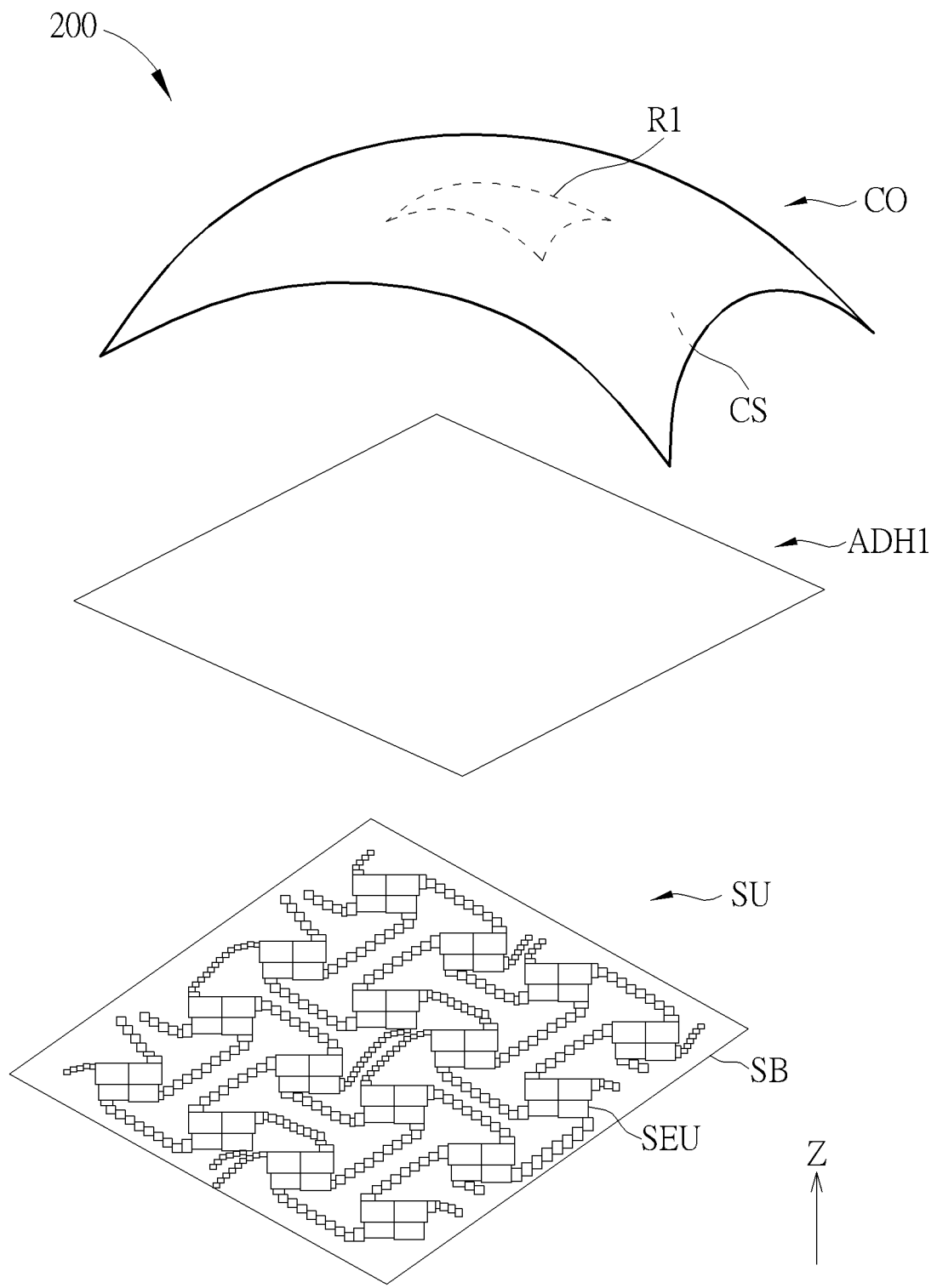
FIG. 4 schematically illustrates an exploded view of an electronic device according to a second embodiment of the present disclosure.
Figure 5:
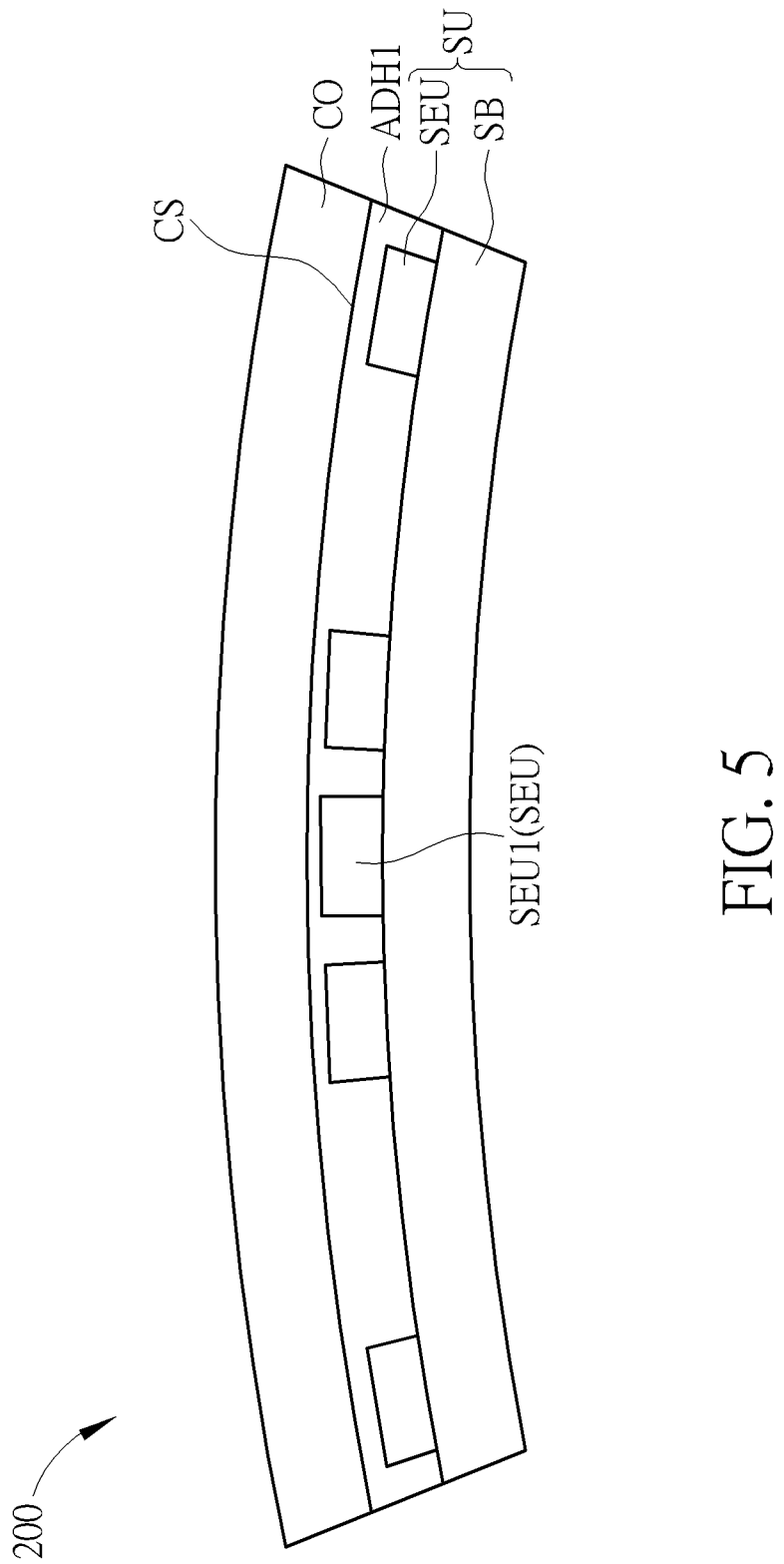
FIG. 5 schematically illustrates a cross-sectional view of the electronic device according to the second embodiment of the present disclosure.

Referring to FIG. 4 and FIG. 5, FIG. 4 schematically illustrates an exploded view of an electronic device according to a second embodiment of the present disclosure, and FIG. 5 schematically illustrates a cross-sectional view of the electronic device according to the second embodiment of the present disclosure. Compared with the electronic device 100 shown in FIG. 2 and FIG. 3, the electronic device 200 of the present embodiment may not be patterned, and the sensing elements SEU may be disposed on the stretchable substrate SB. It should be noted that the pattern of the sensing elements SEU shown in FIG. 4 is just exemplary, and the present disclosure is not limited thereto. According to the present embodiment, the stretchable substrate SB may be formed by including elastic materials. For example, the material of the stretchable substrate SB of the present embodiment may include polydimethylsiloxane (PDMS), polyurethane (PU), polytetrafluoroethylene (PTFE), other suitable elastic materials or combinations of the above-mentioned materials. The structural features of the stretchable sensing unit SU and the cover CO of the electronic device 200 may refer to the description in the above-mentioned first embodiment, and will not be redundantly described.

Figure 6:
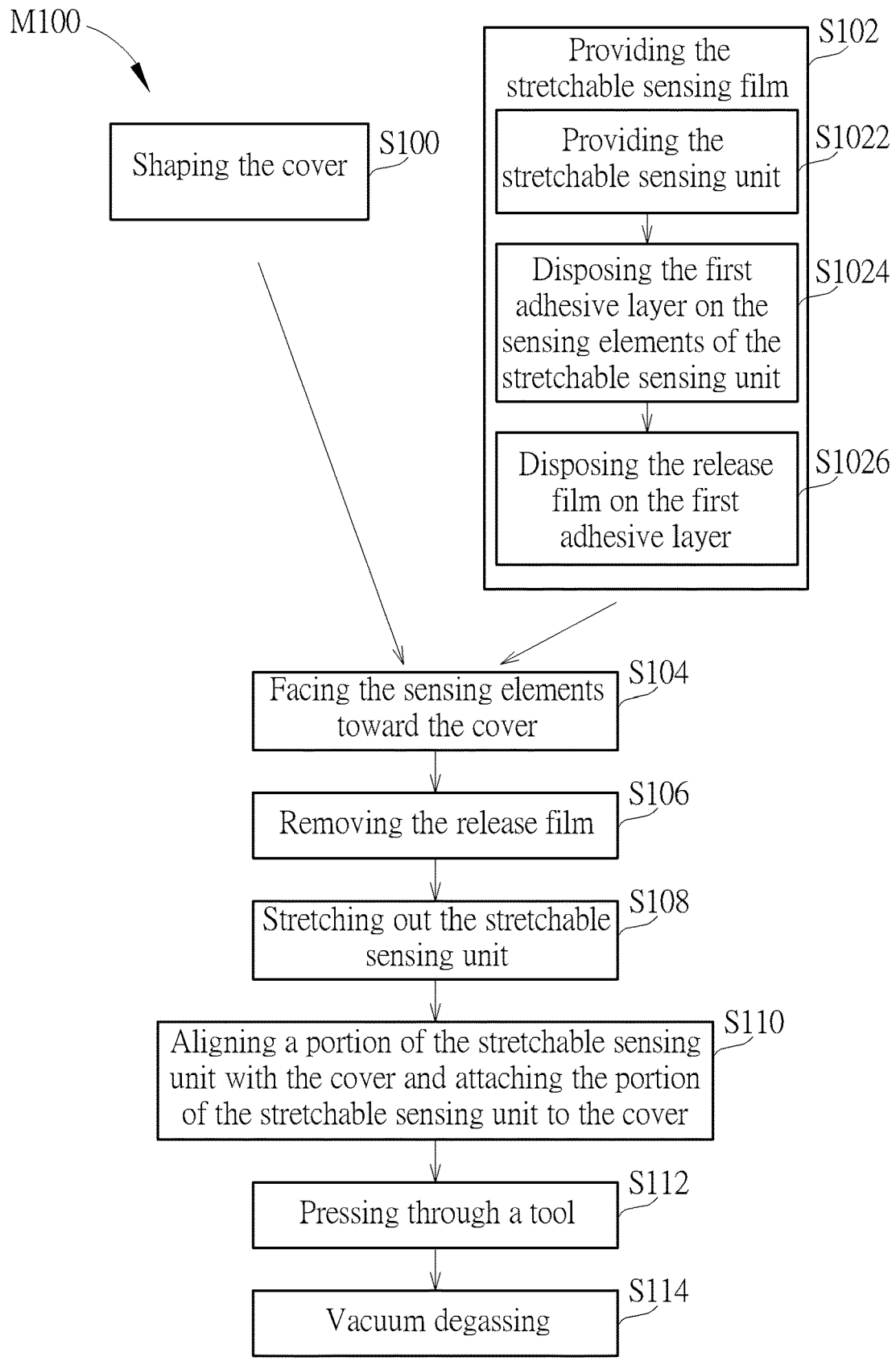
FIG. 6 shows a flow chart of a manufacturing process of the electronic device according to the first embodiment of the present disclosure.
Figure 7:
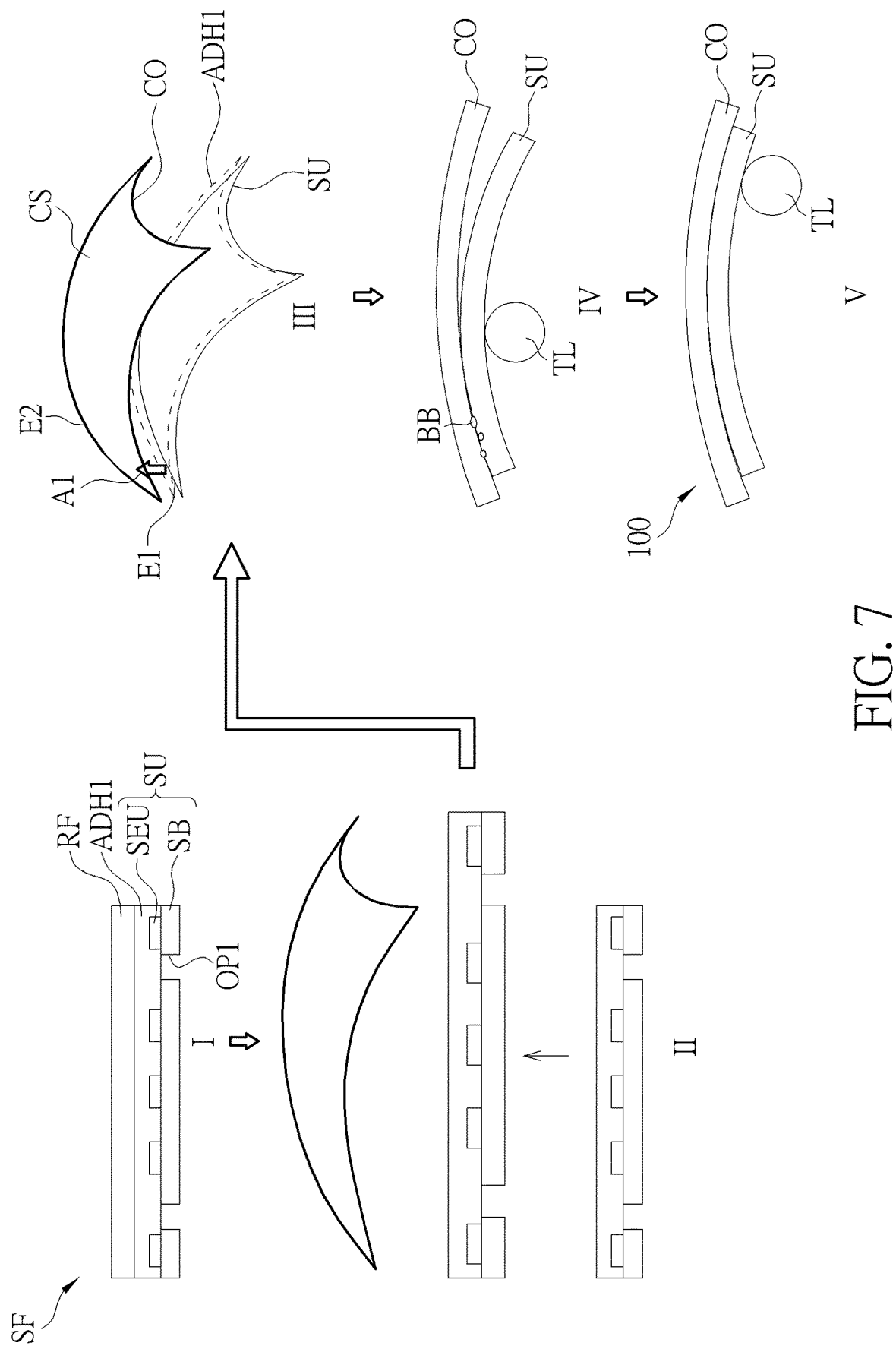
FIG. 7 schematically illustrates the manufacturing processes of the electronic device according to the first embodiment of the present disclosure.

Referring to FIG. 6 and FIG. 7, FIG. 6 shows a flow chart of a manufacturing process of the electronic device according to the first embodiment of the present disclosure, and FIG. 7 schematically illustrates the manufacturing processes of the electronic device according to the first embodiment of the present disclosure. According to the present embodiment, the manufacturing method M100 of the electronic device 100 may include the following steps.

S100: shaping the cover
S102: providing the stretchable sensing film
S104: facing the sensing elements toward the cover
S106: removing the release film
S108: stretching out the stretchable sensing unit
S110: aligning a portion of the stretchable sensing unit with the cover and attaching the portion of the stretchable sensing unit to the cover
S112: pressing through a tool
S114: vacuum degassing
Wherein the step S102 may include:
S1022: providing the stretchable sensing unit
S1024: disposing the first adhesive layer on the sensing elements of the stretchable sensing unit
S1026: disposing the release film on the first adhesive layer Each step of the manufacturing method M100 of the electronic device 100 will be detailed in the following.

The manufacturing method M100 of the electronic device 100 may include the step S100: shaping the cover CO. In detail, according to the usage of the electronic device 100, the cover CO with various shapes may be formed. For example, when the electronic device 100 is applied to the window WD shown in FIG. 1, the cover CO may serve as the glass of the window WD. Therefore, the cover CO may be formed through any suitable glass-shaping method, but not limited thereto. According to the present embodiment, the cover CO may include the curved surface CS, wherein the Gaussian curvature of the curved surface CS is not equal to zero.

The manufacturing method M100 of the electronic device 100 may include the step S102: providing the stretchable sensing film SF. In detail, in the formation of the stretchable sensing film SF, the step S1022 may be performed at first to provide the stretchable sensing unit SU, wherein the stretchable sensing unit SU includes the stretchable substrate SB and the sensing elements SEU disposed on the stretchable substrate SB. The detailed structure of the stretchable sensing unit SU may refer to the above-mentioned embodiment, and will not be redundantly described. Then, the step S1024 may be performed to dispose the first adhesive layer ADH1 on the sensing elements SEU of the stretchable sensing unit SU. After the first adhesive layer ADH1 is disposed, the step S1026 may be performed to dispose the release film RF on the first adhesive layer ADH1, thereby forming the stretchable sensing film SF. Therefore, as shown in the process I of FIG. 7, the stretchable sensing film SF may include the stretchable sensing unit SU, the first adhesive layer ADH1 disposed on the stretchable sensing unit SU and the release film RF disposed on the first adhesive layer ADH1, but not limited thereto.

It should be noted that the step S100 and the step S102 of the manufacturing method M100 may be performed in any suitable order, or the step S100 and the step S102 may be performed simultaneously.

After the step S100 and the step S102 are finished, the step S104 may be performed to face the sensing elements SEU toward the cover CO, such that the stretchable sensing unit SU is expected to be attached to the cover CO in the way that the sensing elements SEU face the cover CO, but not limited thereto. "Facing the sensing elements SEU toward the cover CO" mentioned above may represent that the sensing elements SEU of the stretchable sensing unit SU may be closer to the cover CO comparing to the stretchable substrate SB, and the stretchable substrate SB may be located at a side of the sensing elements SEU facing away from the cover CO, such that the sensing elements SEU are located between the cover CO and the stretchable substrate SB when the stretchable sensing unit SU is attached to the cover CO. In each of the embodiments of the present disclosure, the stretchable sensing unit SU may be attached to the cover CO in the way that "the sensing elements SEU face the cover CO", and it will not be redundantly describe in the following. Then, the step S106 may be performed to remove the release film RF. In detail, the release film RF may be removed from the stretchable sensing unit SU to expose the first adhesive layer ADH1. In the subsequent processes, the stretchable sensing unit SU may be attached to the cover CO through the first adhesive layer ADH1.

Then, the step S108 may be performed to stretch out the stretchable sensing unit SU. In detail, as shown in the process II of FIG. 7, after the cover CO is shaped, the stretchable sensing unit SU may be stretched to a predetermined size according to the size of the cover CO. In other words, the size of the stretchable sensing unit SU may be adjusted through stretching, such that the stretchable sensing unit SU may be attached to the cover layer CO with various sizes. Therefore, the electronic device 100 with various sizes may be formed. It should be noted that before the stretchable sensing unit SU is attached to the cover CO, the shape and the size of the stretchable sensing unit SU may be adjusted through stretching, and the stretchable sensing unit SU may be in a stretchable state at this time. After the stretchable sensing unit SU is attached to the cover CO in the subsequent processes, the stretchable sensing unit SU may be fixed to the cover CO and in a fixed state, in which the stretchable sensing unit SU cannot be stretched, but not limited thereto.

Then, the step S110 may be performed to align a portion of the stretchable sensing unit SU with the cover CO and attach the portion of the stretchable sensing unit SU to the cover CO. For example, as shown in the process III of FIG. 7, to attach the stretchable sensing unit SU to the cover CO, a side E1 of the stretchable sensing unit SU may be attached to a side E2 of the cover CO corresponding to the side E1 at first, but not limited thereto. In some embodiments, a point of the stretchable sensing unit SU may be attached to another point of the cover CO corresponding to the point at first. Since the cover CO of the present embodiment includes the curved surface CS, attaching a portion of the stretchable sensing unit SU in an alignment way, rather than attaching the whole stretchable sensing unit SU at the same time, may reduce occurrence of folds or misalignment during the attaching process, thereby improving the reliability of the electronic device 100.

After the portion of the stretchable sensing unit SU is attached to the cover CO, the step S112 may be performed to press the stretchable sensing unit SU through a tool. In detail, as shown in the process IV of FIG. 7, the stretchable sensing unit SU may be pressed through the tool TL, such that the stretchable sensing unit SU may be completely attached to the cover CO. The tool TL may for example include a wheel, a balloon or other suitable tools. According to the present embodiment, since the stretchable sensing unit SU is attached to the cover CO in the way that the sensing elements SEU face the cover CO, the tool TL may be in contact with the stretchable substrate SB of the stretchable sensing unit SU when the stretchable sensing unit SU is pressed by the tool TL, and the tool TL may not be directly in contact with the sensing elements SEU. Therefore, the damage to the sensing elements SEU from the tool TL may be reduced during the pressing process. In addition, when the stretchable sensing unit SU includes touch elements, the users may for example touch the electronic device 100 at a side of the cover CO. Since the sensing elements SEU may face the cover CO in the present embodiment, the distance between the sensing elements SEU and the cover CO may be reduced, thereby improving the sensitivity of touching.

According to the present embodiment, after the stretchable sensing unit SU is attached to the cover CO, a curing process may be performed to cure the first adhesive layer ADH1. For example, the first adhesive layer ADH1 may be cured through an ultraviolet (UV) curing process, but not limited thereto.

The manufacturing method M100 of the electronic device 100 may further include the step S114: vacuum degassing. As shown in the process IV of FIG. 7, when the stretchable sensing unit SU is attached to the cover CO by being pressed by the tool TL, bubbles BB may be generated between the stretchable sensing unit SU and the cover CO, thereby affecting the reliability of the electronic device 100. Therefore, a vacuum process may be performed to remove the bubbles BB between the stretchable sensing unit SU and the cover CO. After the vacuum process, as shown in the process V of FIG. 7, the electronic device 100 of the present embodiment may be formed.

It should be noted that the above-mentioned steps in the manufacturing method M100 are just exemplary, and other steps may be inserted between the steps in the manufacturing method M100 according to the demands. Furthermore, any step in the manufacturing method M100 may be adjusted in order or deleted according to the demands.

Figure 8:
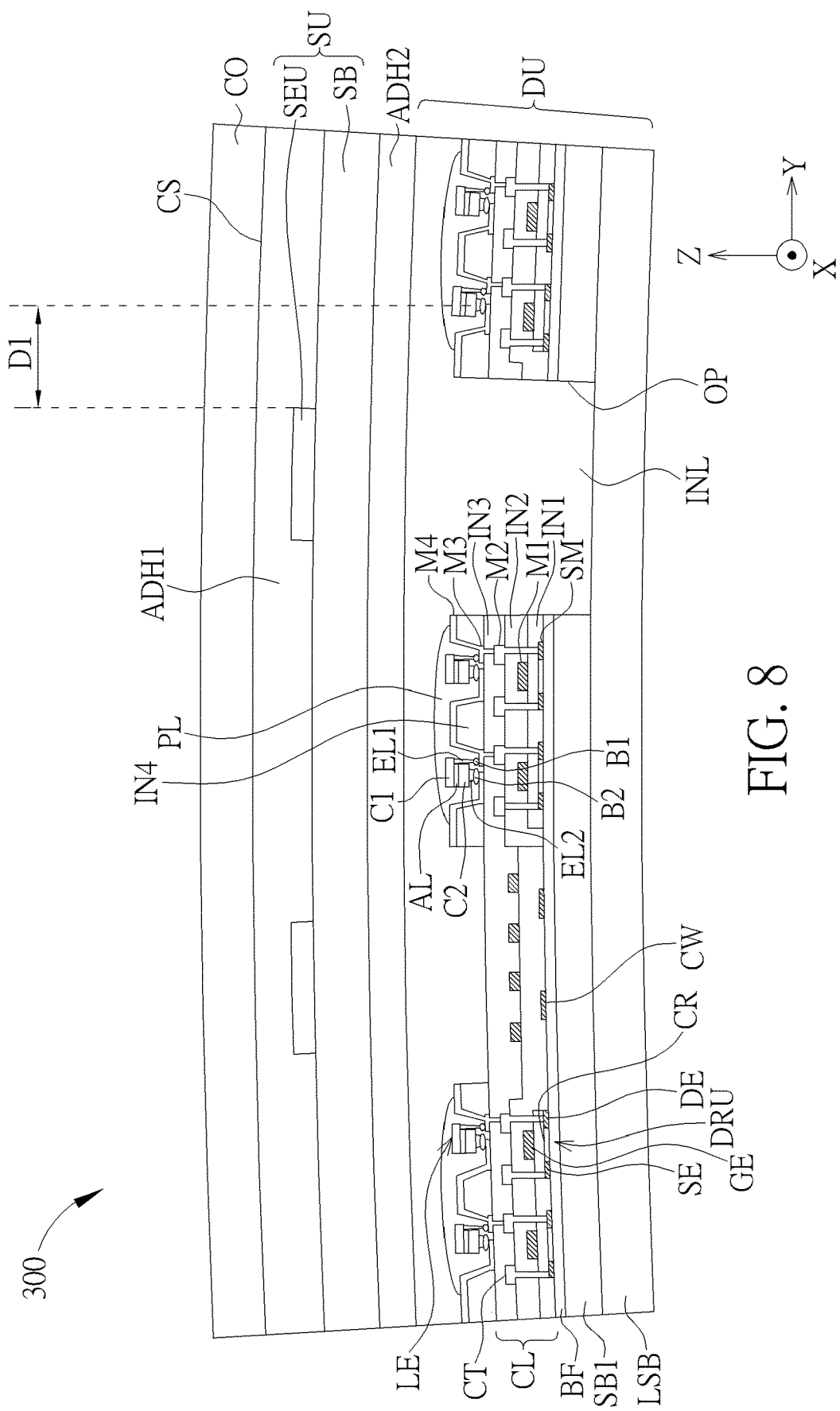
FIG. 8 schematically illustrates a cross-sectional view of an electronic device according to a third embodiment of the present disclosure.

Referring to FIG. 8, FIG. 8 schematically illustrates a cross-sectional view of an electronic device according to a third embodiment of the present disclosure. According to the present embodiment, the electronic device 300 may include the stretchable sensing unit SU, the first adhesive layer ADH1, the cover CO, the second adhesive layer ADH2 and the stretchable display unit DU, but not limited thereto. The stretchable sensing unit SU may be attached to the cover CO through the first adhesive layer ADH1. The stretchable display unit DU may be attached to the stretchable sensing unit SU (or the stretchable substrate SB of the stretchable sensing unit SU) through the second adhesive layer ADH2. The stretchable sensing unit SU of the present embodiment may be disposed between the cover CO and the stretchable display unit DU, but not limited thereto. The descriptions of the stretchable sensing unit SU, the first adhesive layer ADH1 and the cover CO may refer to the above-mentioned first embodiment, and the material of the second adhesive layer ADH2 may refer to the description of the first adhesive layer ADH1, which will not be redundantly described.

As shown in FIG. 8, the stretchable display unit DU may include a substrate SB1, a circuit layer CL and light emitting elements LE, wherein the circuit layer CL may be disposed on the substrate SB1, and the light emitting elements LE may be disposed on the circuit layer CL, but not limited thereto. The elements and the layers included in the stretchable display unit DU will be detailed in the following.

The substrate SB1 may include a flexible substrate, or at least a portion of the substrate SB1 is a flexible substrate. The material of the substrate SB1 may include polyimide, polycarbonate, polyethylene terephthalate, other suitable materials or combinations of the above-mentioned materials. According to the present embodiment, the substrate SB1 may be patterned, and the patterned substrate SB1 may be stretched along any direction, but not limited thereto. Specifically, as shown in FIG. 8, openings OP may be formed in the substrate SB1 with an entire layer, thereby forming the patterned substrate SB1. Other elements and/or layers (such as the circuit layer CL, the light emitting elements LE, and the like) of the stretchable display unit DU may be disposed on the patterned substrate SB1.

The circuit layer CL may include various kinds of wires, active elements and/or passive elements that can be applied to the electronic device 100. For example, the circuit layer CL may include driving units DRU electrically connected to the light emitting elements LE and wires CW, but not limited thereto. Wires CW may for example be electrically connected to the driving units DRU and configured to transmit any suitable signal. The driving units DRU may include thin film transistors and be configured to drive the light emitting elements LE. The circuit layer CL may include a semiconductor layer SM, a metal layer M1, a metal layer M2, an insulating layer IN1 located between the semiconductor layer SM and the metal layer M1, an insulating layer IN2 located between the metal layer M1 and the metal layer M2 and an insulating layer IN3 covering the metal layer M2. The semiconductor layer SM may form channel regions CR, sources SE and drains DE of the driving units DRU, and the metal layer M1 may form gates GE of the driving units DRU and/or the wires CW, but not limited thereto. The material of the semiconductor layer SM may for example include low temperature polysilicon (LTPS), low temperature polysilicon oxide (LTPO) or amorphous silicon (a-Si), but not limited thereto. The metal layer M1 and the metal layer M2 may include any suitable conductive material, such as metal materials, but not limited thereto. The insulating layer IN1, the insulating layer IN2 and the insulating layer IN3 may include any suitable insulating material. It should be noted that the structure of the circuit layer CL shown in FIG. 8 is just exemplary, and the present disclosure is not limited thereto.

The light emitting elements LE may for example include light emitting diodes, but not limited thereto. The light emitting diode may for example include organic light emitting diode (OLED), mini light emitting diode (mini LED), micro light emitting diode (micro LED) or quantum dot light emitting diode (QLED), but not limited thereto. For example, the light emitting element LE shown in FIG. 8 may be an inorganic light emitting diode and include a semiconductor layer C1, a semiconductor layer C2, an active layer AL located between the semiconductor layer C1 and the semiconductor layer C2, an electrode EL1 connected to the semiconductor layer C1 and an electrode EL2 connected to the semiconductor layer C2, but not limited thereto. As shown in FIG. 8, the stretchable display unit DU may further include a metal layer M3 and a metal layer M4 disposed on the circuit layer CL and an insulating layer IN4 located between the metal layer M3 and the metal layer M4. The electrode EL1 and the electrode EL2 may respectively be electrically connected to the metal layer M3 and/or the metal layer M4 through a bonding material B1 and a bonding material B2, and the metal layer M3 and/or the metal layer M4 may be electrically connected to the drains DE of the driving units DRU through contacts CT, such that the light emitting elements LE may be electrically connected to the driving units DRU. The metal layer M3 and the metal layer M4 may include any suitable conductive material, such as metal materials, and the insulating layer IN4 may include any suitable insulating material. In addition, as shown in FIG. 8, the stretchable display unit DU may further include a protecting layer PL disposed on the light emitting elements LE and covering the light emitting elements LE, so as to provide the protecting function.

The stretchable display unit DU may further include an insulating layer BF disposed between the substrate SB1 and the circuit layer CL and an insulating layer INL disposed on the light emitting elements LE in addition to the above-mentioned elements and/or layers, but not limited thereto. The insulating layer BF may for example serve as a buffer layer, and the insulating layer BF may include any suitable buffer material. The insulating layer INL may cover the light emitting elements LE, the circuit layer CL and the substrate SB1 and be filled into the openings OP, so as to provide the protecting function. In some embodiments, the insulating layer INL may include elastic materials, but not limited thereto. In addition, the stretchable display unit DU may further include a substrate LSB disposed under the substrate SB1, but not limited thereto. The substrate LSB may serve as a supporting substrate to support the layers and/or the structures disposed thereon. It should be noted that the stretchable display unit DU shown in FIG. 8 is just exemplary, and the present embodiment is not limited thereto.

According to the present embodiment, as shown in FIG. 8, the sensing elements SEU of the stretchable sensing unit SU may be disposed not corresponding to the light emitting elements LE of the stretchable display unit DU. "A sensing element SEU is not corresponding to a light emitting element LE" described herein may represent that the light emitting element LE is not disposed in a normal direction of the sensing element SEU, or in other words, the sensing element SEU may not be overlapped with the light emitting element LE in the normal direction of the sensing element SEU. It should be noted that since the electronic device 300 includes a curved surface, the normal directions of the sensing elements SEU may be different directions. In some embodiments, a light emitting element LE may be disposed between two sensing elements SEU in the normal direction of the light emitting element LE. In some embodiments, a light emitting element LE may be overlapped with the opening OP of the substrate SB1 in the normal direction of the light emitting element LE. Since the sensing elements SEU may be disposed not corresponding to the light emitting elements LE, the influence of the sensing elements SEU on the display effect of the electronic device 300 may be reduced, thereby improving the performance of the electronic device 300.

According to the present embodiment, different regions of the curved surface CS of the cover CO of the electronic device 300 may have different Gaussian curvatures. In other words, the cover CO may be curved in different degrees in different regions. Accordingly, when the stretchable display unit DU is attached to the stretchable sensing unit SU, the relative positions of the sensing elements SEU and the light emitting elements LE corresponding to different regions on the curved surface CS may be different. As shown in FIG. 8, in a projection plane of the electronic device 300, a distance Dl may be included between a sensing element SEU and a light emitting element LE. It should be noted that the elements and/or the layers (such as the cover CO, the stretchable sensing unit SU, and the like) of the electronic device 300 may be stacked along a stacking direction (such as the direction Z), and the projection plane may be defined as any suitable plane (such as the XY plane) perpendicular to the stacking direction, but not limited thereto. The distance Dl may be the distance between a sensing element SEU and a light emitting element LE which is the closest to the sensing element SEU. For example, the distance Dl may be defined as the distance from an end of the sensing element SEU which is the closest to the light emitting element LE to a midpoint of the light emitting element LE (such as the midpoint of the active layer AL of the light emitting element LE) on the projection plane of the electronic device 300, but not limited thereto. In other embodiments, the distance Dl may be defined through any suitable method. According to the present embodiment, based on the Gaussian curvatures of different regions on the curved surface to which the sensing elements SEU and the light emitting elements LE correspond, the distance Dl between the sensing element SEU and the light emitting element LE may vary. For example, the curved surface CS may include a region with a first Gaussian curvature and a region with a second Gaussian curvature, wherein the first Gaussian curvature and the second Gaussian curvature are different, and the distance Dl between the sensing element SEU and the light emitting element LE disposed corresponding to the region with the first Gaussian curvature and the distance Dl between the sensing element SEU and the light emitting element LE disposed corresponding to the region with the second Gaussian curvature may be different.

Figure 9:
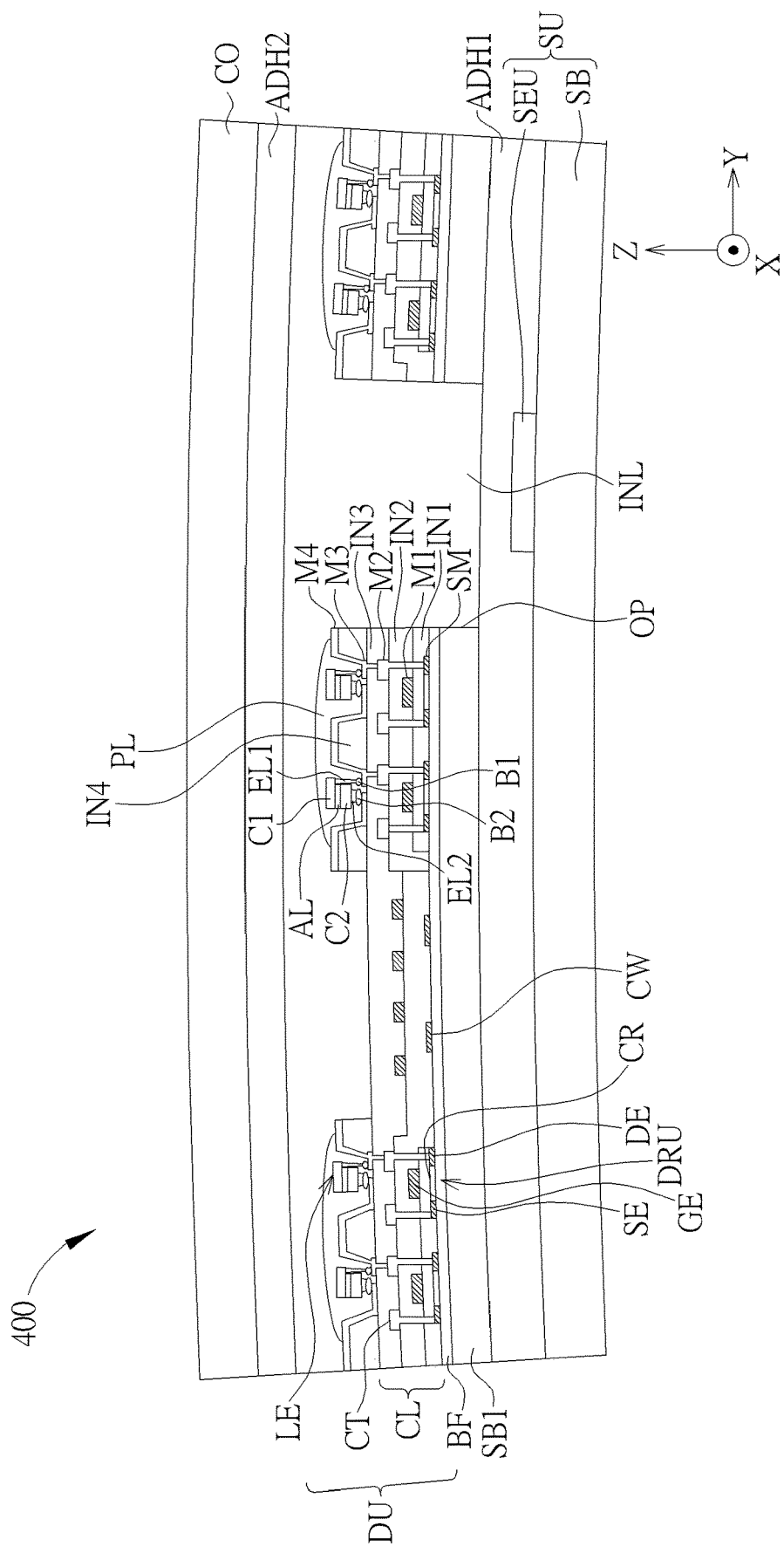
FIG. 9 schematically illustrates a cross-sectional view of an electronic device according to a fourth embodiment of the present disclosure.

Referring to FIG. 9, FIG. 9 schematically illustrates a cross-sectional view of an electronic device according to a fourth embodiment of the present disclosure. One of the differences between the electronic device 400 of the present embodiment and the electronic device 300 shown in FIG. 8 is the order of the stacked layers. According to the present embodiment, the electronic device 400 may include the stretchable sensing unit SU, the first adhesive layer ADH1, the stretchable display unit DU, the second adhesive layer ADH2 and the cover CO, wherein the stretchable sensing unit SU may be attached to the stretchable display unit DU through the first adhesive layer ADH1, and the stretchable display unit DU may be attached to the cover CO through the second adhesive layer ADH2. In other words, the stretchable display unit DU may be disposed between the cover CO and the stretchable sensing unit SU, but not limited thereto.

When the stretchable sensing unit SU is attached to the stretchable display unit DU, the sensing elements SEU of the stretchable sensing unit SU may face the cover CO and/or the stretchable display unit DU, but not limited thereto. The features of the elements and/or the layers of the electronic device 400 may refer to the descriptions mentioned above, and will not be redundantly described. In addition, in the electronic device 400, the sensing elements SEU may for example be disposed corresponding to the openings OP of the substrate SB1 of the stretchable display unit DU, but not limited thereto. It should be noted that although the stretchable substrate SB of the stretchable sensing unit SU is shown as an entire layer in FIG. 9, the stretchable substrate SB may be a patterned substrate. For example, the stretchable substrate SB may be the stretchable substrate SB shown in FIG. 3 and include the island portions IS, the bridge portions BR and the openings OP1.

Figure 10:
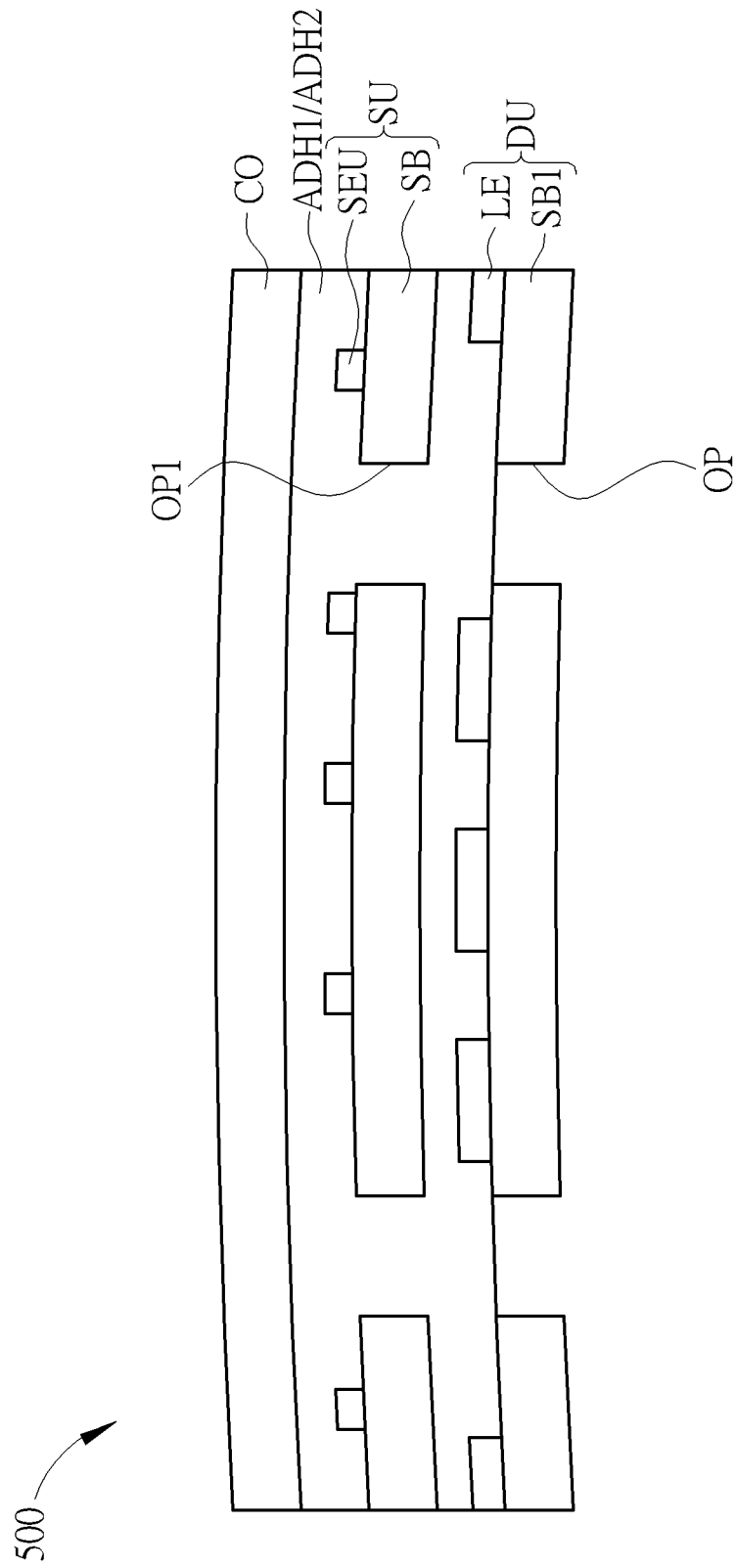
FIG. 10 schematically illustrates a cross-sectional view of an electronic device according to a fifth embodiment of the present disclosure.

Referring to FIG. 10, FIG. 10 schematically illustrates a cross-sectional view of an electronic device according to a fifth embodiment of the present disclosure. In order to simplify the figure, FIG. 10 just shows the substrate SB1 and the light emitting elements LE of the stretchable display unit DU, and other layers and/or elements of the stretchable display unit DU are omitted. As shown in FIG. 10, the electronic device 500 may include the stretchable display unit DU, the stretchable sensing unit SU and the cover CO, wherein the stretchable display unit DU may be attached to the stretchable sensing unit SU, and the stretchable sensing unit SU may be attached to the cover CO, but not limited thereto. The stretchable substrate SB of the stretchable sensing unit SU may include the openings OP1 in the present embodiment, that is, the stretchable substrate SB may be a patterned substrate shown in FIG. 2 and FIG. 3, but not limited thereto. In the condition that the stretchable substrate SB includes the openings OP1, the first adhesive layer ADH1 for attaching the stretchable display unit DU to the stretchable sensing unit SU and the second adhesive layer ADH2 for attaching the stretchable sensing unit SU to the cover CO may be in contact with each other through the openings OP1. In detail, the second adhesive layer ADH2 may be filled into the openings OP1, thereby being in contact with the first adhesive layer ADH1. In addition, as shown in FIG. 10, the pattern of the stretchable substrate SB and the pattern of the substrate SB1 may substantially be the same in the present embodiment, and the openings OP1 of the stretchable substrate SB may for example correspond to the openings OP of the substrate SB1 of the stretchable display unit DU, but not limited thereto. The features of the elements and/or the layers of the electronic device 500 may refer to the descriptions mentioned above, and will not be redundantly described.

Figure 11:
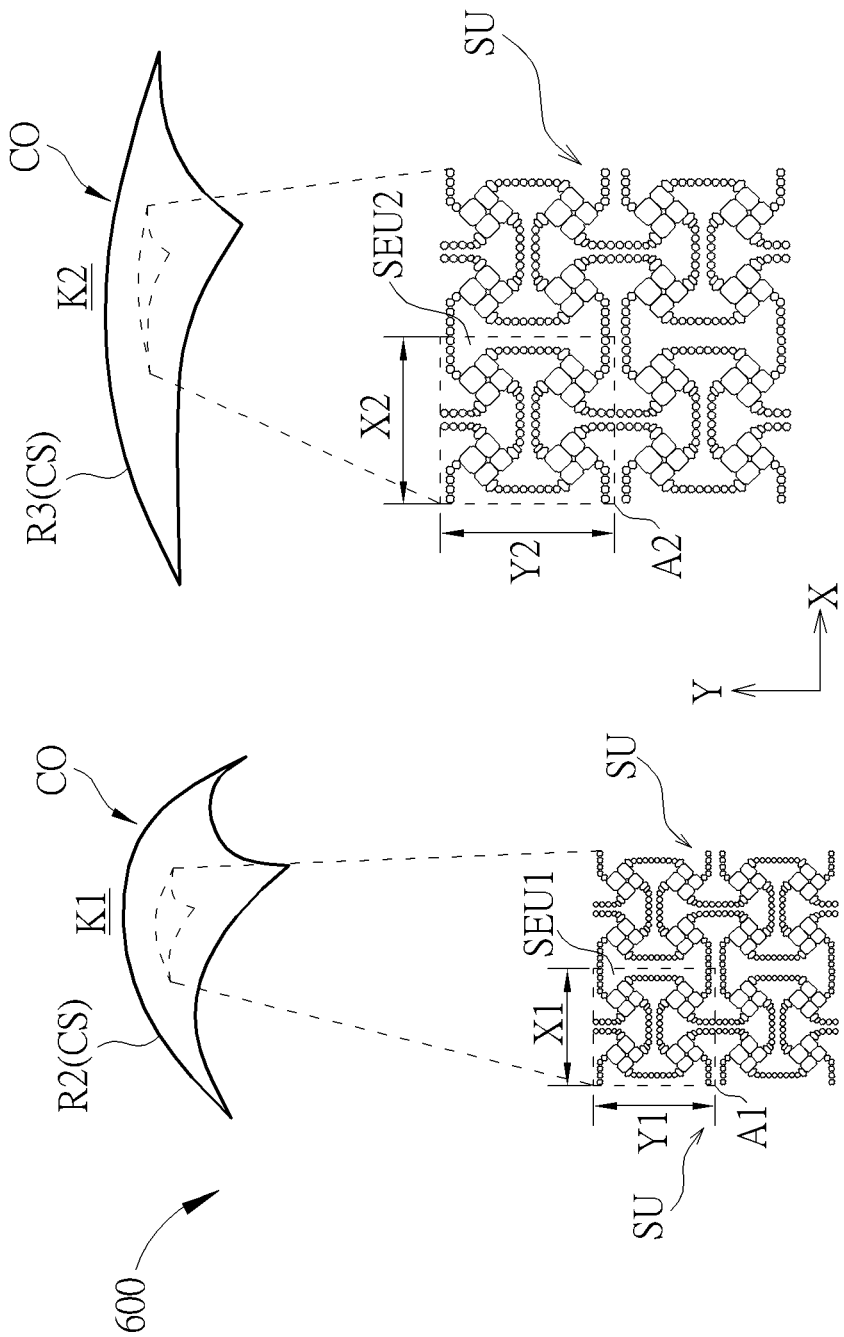
FIG. 11 schematically illustrates a top view of an electronic device according to a sixth embodiment of the present disclosure.

Referring to FIG. 11, FIG. 11 schematically illustrates a top view of an electronic device according to a sixth embodiment of the present disclosure. In the present embodiment, the curved surface CS of the cover CO of the electronic device 600 may include a plurality of regions, wherein the Gaussian curvatures of the regions may be different, or the regions may be curved in different degree. Specifically, the degree of curvature of a curved surface may be determined through the absolute value of the Gaussian curvature of the curved surface, wherein the degree of curvature of the curved surface may be greater when the absolute value of the Gaussian curvature of the curved surface is greater. For example, FIG. 11 shows a region R2 and a region R3 of the curved surface CS, wherein the region R2 has a Gaussian curvature K1, the region R3 has a Gaussian curvature K2, and the absolute value of the Gaussian curvature K1 may be greater than the absolute value of the Gaussian curvature K2 (that is, $|K1|>|K2|$). In other words, the degree of curvature of the region R2 may be greater comparing to the region R3. Since the Gaussian curvature K1 and the Gaussian curvature K2 shown in FIG. 11 may for example be positive, "the absolute value of the Gaussian curvature K1 is greater than the absolute value of the Gaussian curvature K2" may indicate that the Gaussian curvature K1 is greater than the Gaussian curvature K2. In some embodiments, when the Gaussian curvature K1 and the Gaussian curvature K2 are negative, "the absolute value of the Gaussian curvature K1 is greater than the absolute value of the Gaussian curvature K2" may indicate that the Gaussian curvature K1 is lower than the Gaussian curvature K2. It should be noted that although the Gaussian curvature of the regions mentioned above are defined through the curved surface CS of the cover CO, the present embodiment is not limited thereto. In some embodiments, the Gaussian curvature may be defined through surfaces of other layers in addition to the cover CO.

According to the present embodiment, the projection area of the sensing element corresponding to a region with a greater absolute value of the Gaussian curvature may be lower. For example, the absolute value of the Gaussian curvature K1 of the region R2 may be greater than the absolute value of the Gaussian curvature K2 of the region R3, and the projection area A1 of the first sensing element SEU1 corresponding to the region R2 may be lower than the projection area A2 of the second sensing element SEU2 corresponding to the region R3. As shown in FIG. 11, the first sensing element SEU1 is disposed between the region R2 and the stretchable substrate (not shown), and the second sensing element SEU2 is disposed between the region R3 and the stretchable substrate (not shown). "The projection area of the sensing element" may be defined as the area of the sensing element on the projection plane, wherein the projection plane may be any suitable plane (such as the XY plane) perpendicular to the stacking direction (such as the direction Z) of the elements and/or the layers of the electronic device 600, but not limited thereto. In the present embodiment, the projection area of the sensing element may for example be measured by taking photos. That is, the size of the sensing element on the projection plane may be presented by photos, and the area of the sensing element in the photos may be measured and regarded as the projection area of the sensing element, but not limited thereto. For example, as shown in FIG. 11, the pattern of the first sensing element SEU1 on the projection plane may for example be a rectangle having a width X1 and a height Y1, and the projection area A1 of the first sensing element SEU1 may be the product of the width X1 and the height Y1 (that is, $A1=X1*Y1$), but not limited thereto. Similarly, the pattern of the second sensing element SEU2 on the projection plane may for example be a rectangle having a width X2 and a height Y2, and the projection area A2 of the second sensing element SEU2 may be the product of the width X2 and the height Y2 (that is, $A2=X2*Y2$). It should be noted that the sensing element including the rectangular pattern is exemplarily taken as an example for describing the measuring method of the projection area of the sensing element, and the present embodiment is not limited thereto. In some embodiments, the sensing element may include different patterns according to other suitable defining methods. In some embodiments, the metal grid of the sensing element may include other suitable patterns, which is not limited to the pattern shown in FIG. 11.

Figure 12:
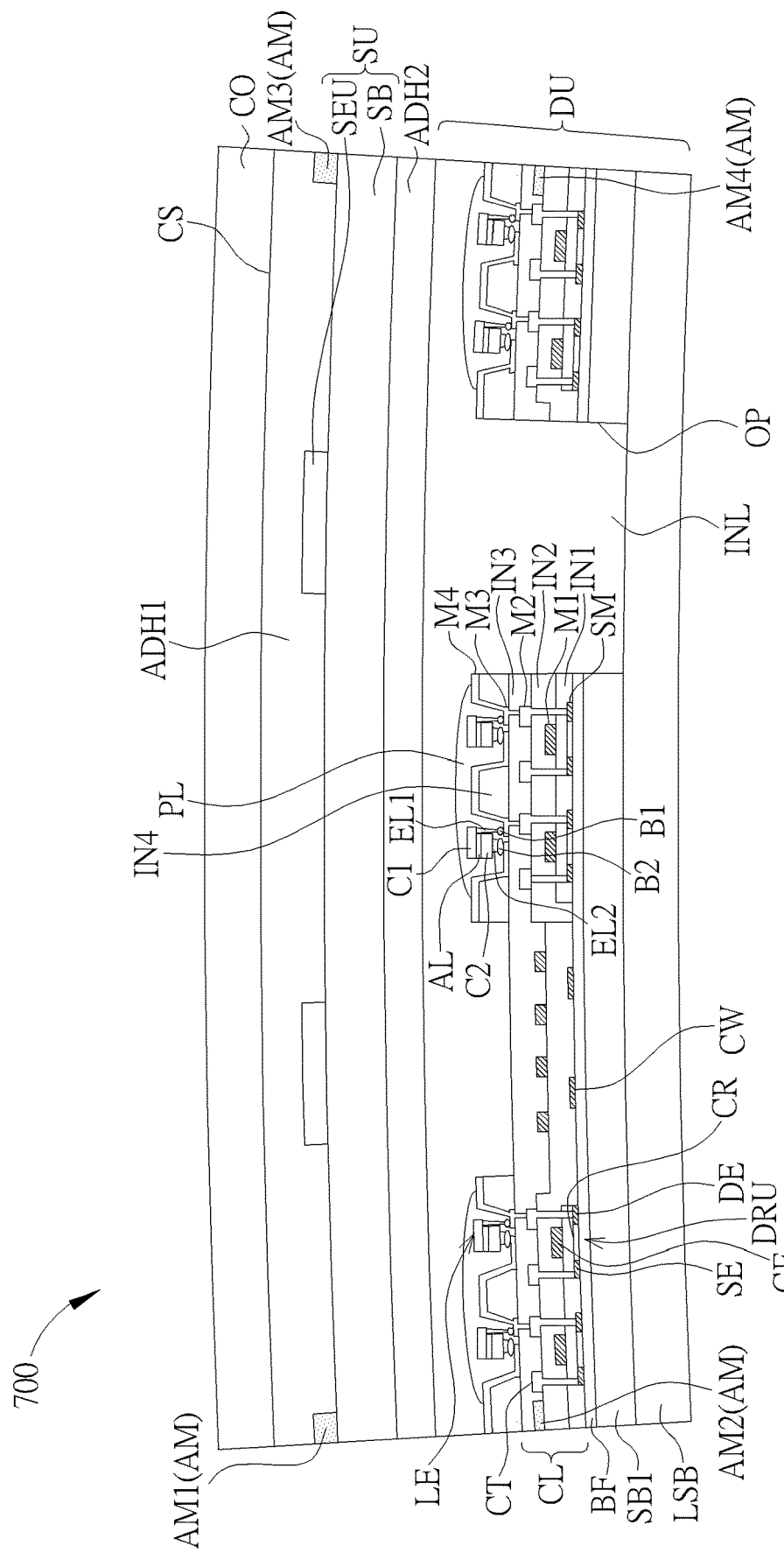
FIG. 12 schematically illustrates a cross-sectional view of an electronic device according to a seventh embodiment of the present disclosure.

Referring to FIG. 12, FIG. 12 schematically illustrates a cross-sectional view of an electronic device according to a seventh embodiment of the present disclosure. The electronic device 700 of the present embodiment may include the cover CO, the stretchable sensing unit SU attached to the cover CO through the first adhesive layer ADH1, the stretchable display unit DU attached to the stretchable sensing unit SU through the second adhesive layer ADH2 and a plurality of alignment marks AM, wherein the alignment marks AM may be disposed respectively in the stretchable sensing unit SU and the stretchable display unit DU, but not limited thereto. According to the present embodiment, the alignment marks AM disposed in the stretchable sensing unit SU may correspond to the alignment marks AM disposed in the stretchable display unit DU. For example, as shown in FIG. 12, a first alignment mark AM1 may be included in the stretchable sensing unit SU, and a second alignment mark AM2 may be included in the stretchable display unit DU, wherein the first alignment mark AM1 may correspond to the second alignment mark AM2. "The first alignment mark AM1 corresponds to the second alignment mark AM2" described herein may represent that the first alignment mark AM1 and the second alignment mark AM2 are overlapped with each other in the normal directions of the first alignment mark AM1 and/or the second alignment mark AM2. In addition, the electronic device 700 of the present embodiment may include a plurality of sets of alignment marks AM which are corresponding to each other. For example, the electronic device 700 may further include a third alignment mark AM3 disposed in the stretchable sensing unit SU and a fourth alignment mark AM4 disposed in the stretchable display unit DU, wherein the third alignment mark AM3 may correspond to the fourth alignment mark AM4. Through the alignment marks AM corresponding to each other in the stretchable sensing unit SU and the stretchable display unit DU, the possibility of error or misalignment when attaching the stretchable display unit DU to the stretchable sensing unit SU may be reduced, thereby improving the yields of the electronic device 700.

According to the present embodiment, the alignment marks AM in the stretchable sensing unit SU may be disposed on the stretchable substrate SB and at a position without the sensing element SEU (or the metal grid of the sensing element SEU). For example, the alignment marks AM and the sensing elements SEU may be disposed in the same layer, but not limited thereto. In addition, the alignment marks AM in the stretchable display unit DU may be disposed not corresponding to the light emitting elements LE, or the alignment marks AM is not overlapped with the light emitting elements LE. For example, the alignment marks AM may be disposed on the insulating layer IN2, but not limited thereto. In some embodiments, the alignment marks AM in the stretchable display unit DU may be disposed on the insulating layer IN1.

Figure 13:
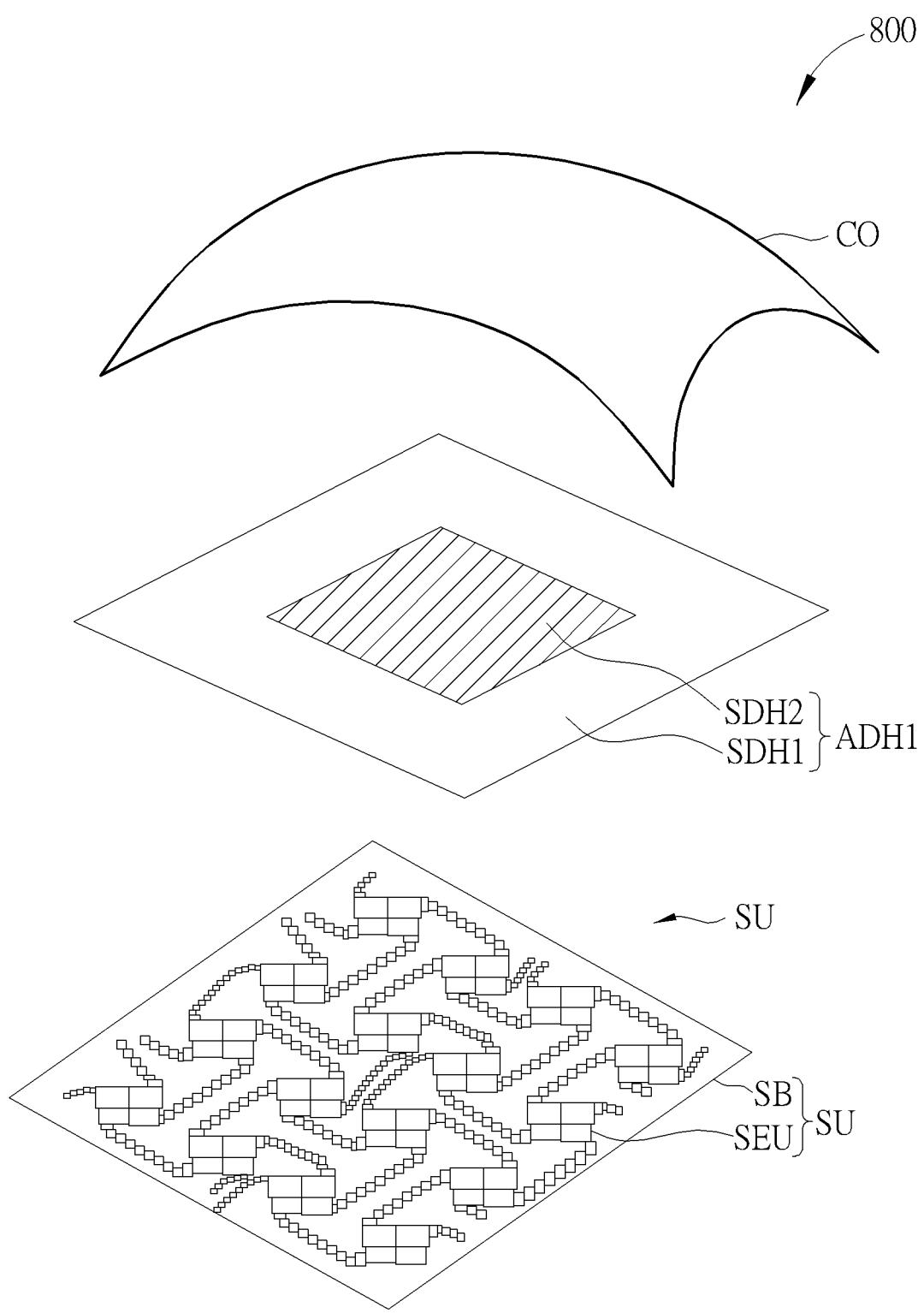
FIG. 13 schematically illustrates an exploded view of an electronic device according to an eighth embodiment of the present disclosure.

Referring to FIG. 13, FIG. 13 schematically illustrates an exploded view of an electronic device according to an eighth embodiment of the present disclosure. The electronic device 800 of the present embodiment may include the cover CO, the first adhesive layer ADH1 and the stretchable sensing unit SU, wherein the first adhesive layer ADH1 may include a first sub-adhesive layer SDH1 and a second sub-adhesive layer SDH2, but not limited thereto. According to the present embodiment, the first sub-adhesive layer SDH1 and the second sub-adhesive layer SDH2 may respectively correspond to two portions of the cover CO having different Gaussian curvatures, and the density of the first sub-adhesive layer SDH1 and the density of the second sub-adhesive layer SDH2 may be different. Specifically, the density of the first sub-adhesive layer SDH1 may be greater than the density of the second sub-adhesive layer SDH2, and the Gaussian curvature of the portion of the cover CO to which the first sub-adhesive layer SDH1 correspond may be greater than the Gaussian curvature of the portion of the cover CO to which the second sub-adhesive layer SDH2 correspond. "The density of the first sub-adhesive layer SDH1 and the density of the second sub-adhesive layer SDH2" mentioned above may respectively represent the density of the material of the first sub-adhesive layer SDH1 and the density of the material of the second sub-adhesive layer SDH2. In other words, the density of the material of the first sub-adhesive layer SDH1 may be greater than the density of the material of the second sub-adhesive layer SDH2. In some embodiments, the area of the first sub-adhesive layer SDH1 may be greater than the area of the second sub-adhesive layer SDH2. In some embodiments, the area of the second sub-adhesive layer SDH2 may be greater than the area of the first sub-adhesive layer SDH1. According to the present embodiment, since the first adhesive layer ADH1 may include the first sub-adhesive layer SDH1 and the second sub-adhesive layer SDH2 having different densities according to different Gaussian curvatures of the cover CO, the attaching effect of the first adhesive layer ADH1 may be improved. It should be noted that the shapes of the first sub-adhesive layer SDH1 and the second sub-adhesive layer SDH2 shown in FIG. 13 are just exemplary, and the present disclosure is not limited thereto. In some embodiments, the second sub-adhesive layer SDH2 may be patterned and for example be dot-shaped, but not limited thereto. In addition, the first adhesive layer ADH1 may include more sub-adhesive layers in some embodiments, which is not limited to the structure shown in FIG. 13. It should be noted that although the stretchable substrate SB of the stretchable sensing unit SU is shown as an entire layer in FIG. 13, the stretchable substrate SB may be a patterned substrate.

Figure 14:
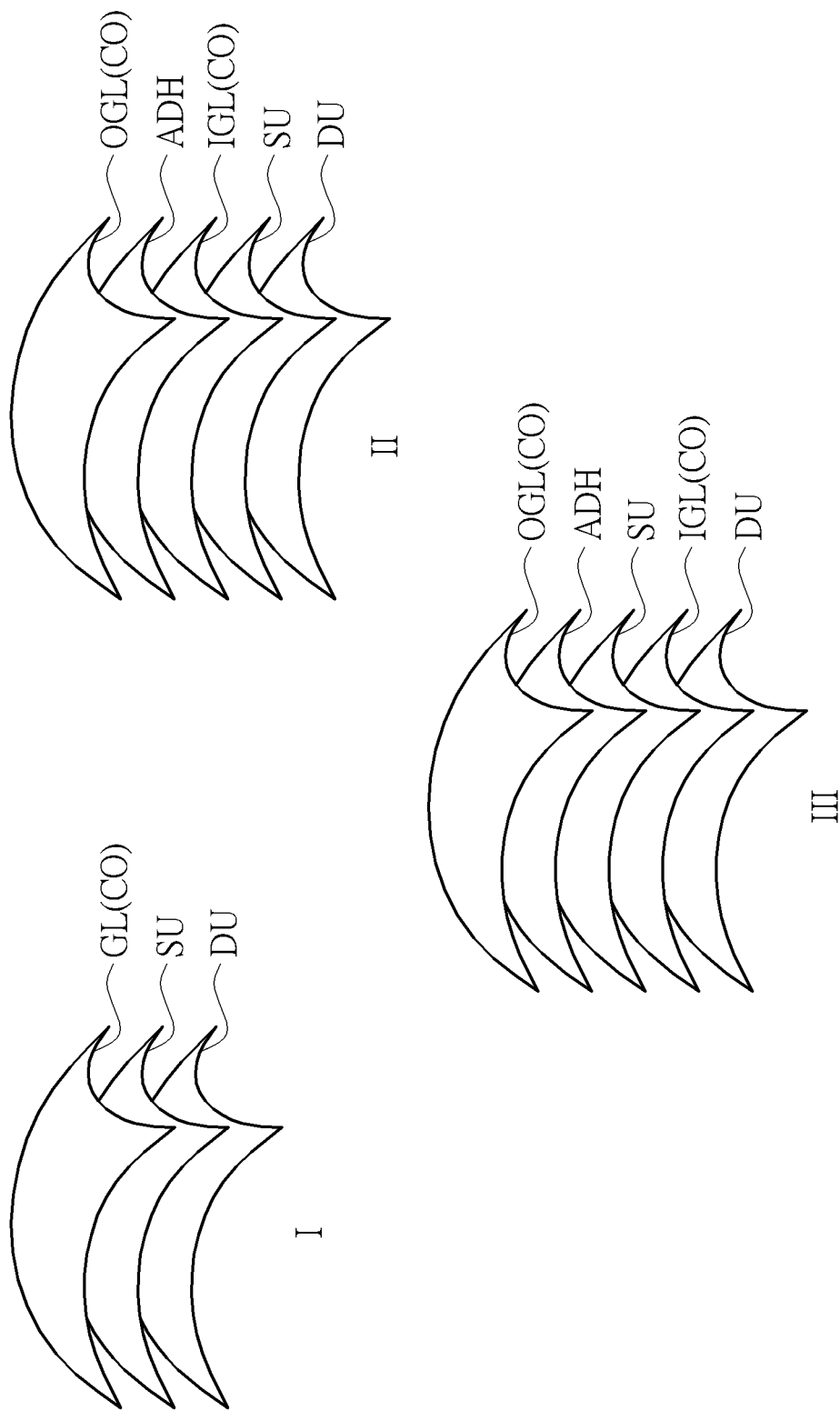
FIG. 14 schematically illustrates an exploded view of an electronic device according to a ninth embodiment of the present disclosure.

Referring to FIG. 14, FIG. 14 schematically illustrates an exploded view of an electronic device according to a ninth embodiment of the present disclosure. In order to simplify the figure, each of the elements and/or the layers is shown as a single layer in FIG. 14. The electronic device 900 of the present embodiment may for example be the electronic device that is applied to the windows (such as the window WD shown in FIG. 1) of a vehicle. Therefore, the cover CO of the electronic device 900 may for example be the glass of the window WD. FIG. 14 shows some examples of the electronic device 900 of the present embodiment. In the example I of FIG. 14, the stretchable sensing unit SU may be attached to the surface of the glass GL of the window WD, and the stretchable display unit DU may be attached to the stretchable sensing unit SU. In the example II of FIG. 14, the window WD may include an inner glass IGL and an outer glass OGL, the stretchable sensing unit SU may be attached to the surface of the inner glass IGL, and the stretchable display unit DU may be attached to the stretchable sensing unit SU. In addition, the inner glass IGL may be attached to the surface of the outer glass OGL through an adhesive layer ADH, wherein the adhesive layer ADH may include any suitable adhesive material, such as polyvinyl butyral (PVB), but not limited thereto. In the example III of FIG. 14, the window WD may include the inner glass IGL and the outer glass OGL, and the stretchable sensing unit SU may be disposed between the inner glass IGL and the outer glass OGL. For example, the stretchable sensing unit SU may be attached to the outer glass OGL through the adhesive layer ADH at first, the inner glass IGL may be attached to the stretchable sensing unit SU, and the stretchable display unit DU may be attached to the inner glass IGL. When the electronic device 900 includes the inner glass IGL and the outer glass OGL (as shown in example II and example III), the users may for example operate the electronic device 900 at a side of the inner glass IGL and/or at a side of the outer glass OGL, but the present disclosure is not limited thereto. For example, when the users operate the electronic device 900 at the inner side more frequently, the stretchable sensing unit SU may be attached to the outer glass OGL and/or the inner glass IGL in the way that the sensing elements (not shown) face the inner glass IGL; and when the users operate the electronic device 900 at the outer side more frequently, the stretchable sensing unit SU may be attached to the outer glass OGL and/or the inner glass IGL in the way that the sensing elements (not shown) face the outer glass OGL, but not limited thereto. It should be noted that the structure of the electronic device 900 shown in FIG. 14 is just exemplary, and the present embodiment is not limited thereto.

Figure 15:
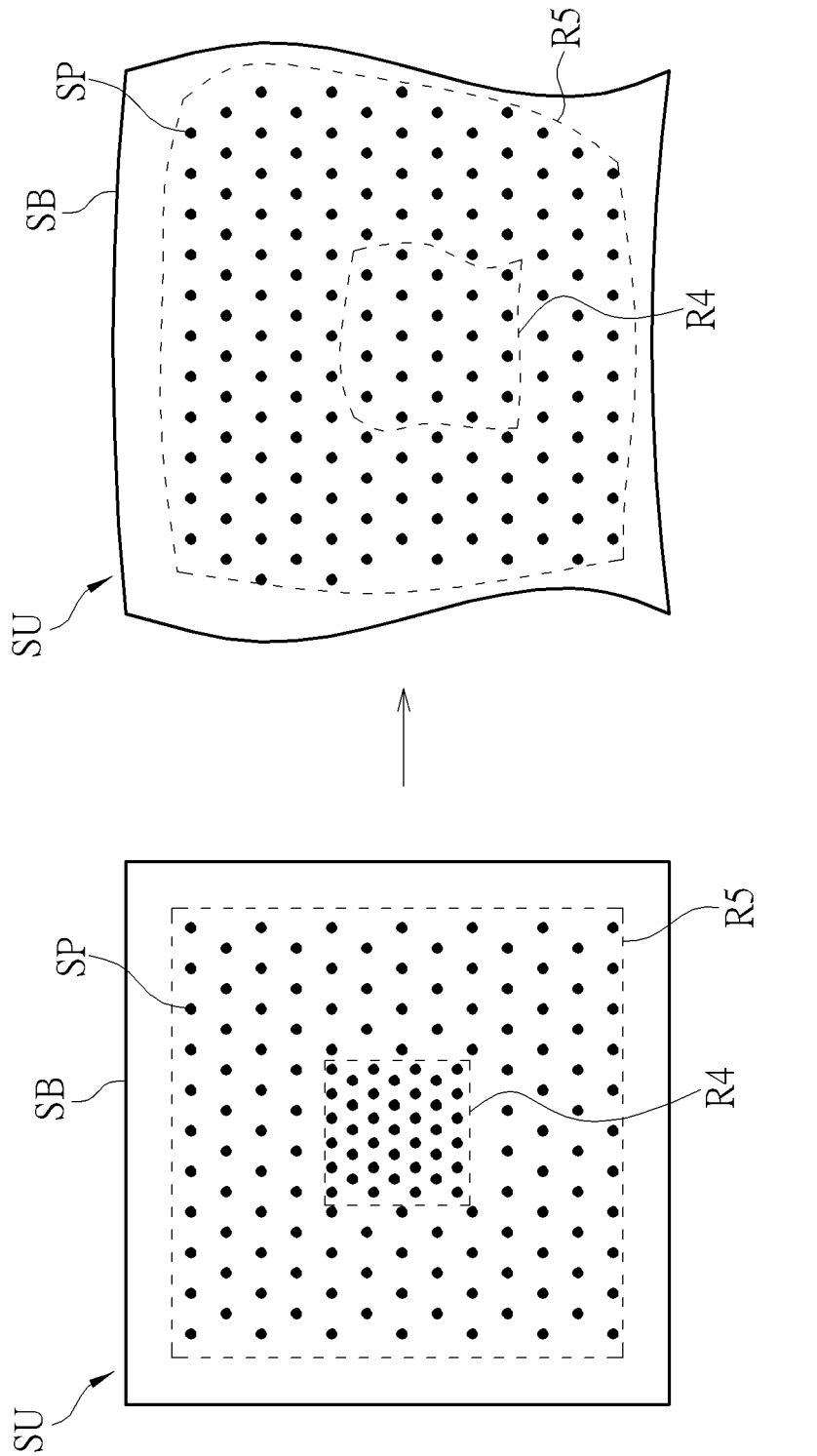
FIG. 15 schematically illustrates a top view of a stretchable sensing unit according to a tenth embodiment of the present disclosure.

Referring to FIG. 15, FIG. 15 schematically illustrates a top view of a stretchable sensing unit according to a tenth embodiment of the present disclosure. As mentioned above, before the stretchable sensing unit SU is attached to the cover CO, a stretching process may be performed on the stretchable sensing unit SU. The structure I of FIG. 15 shows the structure of the stretchable sensing unit SU before stretching, and the structure II of FIG. 15 shows the structure of the stretchable sensing unit SU after stretching. According to the present embodiment, the stretchable sensing unit SU before stretching may include a plurality of regions, wherein the regions are respectively attached to different portions of a surface having different Gaussian curvatures in the subsequent processes. In addition, in different regions of the stretchable sensing unit SU before stretching, the designs of the sensing unit may be different. Specifically, when a region of the stretchable sensing unit SU before stretching would be attached to a surface with a greater Gaussian curvature in the subsequent processes, the density of the sensing points in the region may be greater. For example, as shown in the structure I of FIG. 15 the stretchable sensing unit SU before stretching may include a region R4 and a region R5, wherein the region R4 and the region R5 may respectively be attached to a portion of the surface with a Gaussian curvature K1 and another portion of the surface with a Gaussian curvature K2, wherein the Gaussian curvature K1 is greater than the Gaussian curvature K2. Accordingly, the density of the sensing points SP in the region R4 may be greater than the density of the sensing points SP in the region R5. The density of the sensing points may be defined as the number of the sensing points SP in an unit area, but not limited thereto. In the present embodiment, the sensing point SP may be defined as the minimum sensing unit in the stretchable sensing unit SU. That is, the sensing point SP may for example be the sensing element SEU, but not limited thereto. In some embodiments, the sensing points SP in the stretchable sensing unit SU may be defined through other suitable methods. As shown in the structure II of FIG. 15, through the above-mentioned design, after the stretchable sensing unit SU is attached to the surface of the cover CO having different Gaussian curvatures, the density of the sensing points SP in the region R4 of the stretchable sensing unit SU and the density of the sensing points SP in the region R5 of the stretchable sensing unit SU may substantially be the same. In other words, after the stretchable sensing unit SU is attached to the cover CO, the possibility that the distribution of the sensing points SP are affected due to the variation of the Gaussian curvature of the curved surface may be reduced. Therefore, the possibility that the sensing function of the stretchable sensing unit SU is affected due to the great difference of the densities of the sensing points SP in different regions of the stretchable sensing unit SU may be reduced. It should be noted that the structure shown in FIG. 15 is just exemplary, and the present embodiment is not limited thereto. In some embodiments, the stretchable sensing unit SU may include more than two regions, and these regions may be attached to different portions of the surface having different Gaussian curvatures. It should be noted that although the stretchable substrate SB of the stretchable sensing unit SU is shown as an entire layer in FIG. 15, the stretchable substrate SB may be a patterned substrate.

In summary, an electronic device and a manufacturing method of the electronic device is provided by the present disclosure. The electronic device includes the cover and the stretchable sensing unit attached to the cover. The cover of the electronic device may include a surface with a Gaussian curvature not equal to zero, and the stretchable sensing unit may be attached to the surface with the Gaussian curvature not equal to zero. Accordingly, the electronic device of the present disclosure may be applied to devices with spherical surfaces or other devices with curved-surface.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An electronic device, comprising:
   a cover having a curved surface which has a first region with a first Gaussian curvature not equal to zero and a second region with a second Gaussian curvature, wherein an absolute value of the first Gaussian curvature is greater than an absolute value of the second Gaussian curvature; and
   a stretchable sensing unit attached to the cover, comprising a stretchable substrate, a first sensing element, and a second sensing element, wherein the first sensing element and the second sensing element are disposed on the stretchable substrate;
   wherein the first sensing element is disposed between the first region of the curved surface and the stretchable substrate, the second sensing element is disposed between the second region of the curved surface and the stretchable substrate, and a projection area of the first sensing element is less than a projection area of the second sensing element.

2. The electronic device according to claim 1, wherein the stretchable sensing unit is attached to the cover through a first adhesive layer.

3. The electronic device according to claim 1, wherein the stretchable substrate has a plurality of island portions and a plurality of bridge portions, and each of the plurality of bridge portions connects at least two of the plurality of island portions.

4. The electronic device according to claim 1, further comprising a stretchable display unit attached to the stretchable sensing unit through a second adhesive layer.

5. The electronic device according to claim 4, wherein the stretchable sensing unit is disposed between the cover and the stretchable display unit.

6. The electronic device according to claim 4, wherein the stretchable display unit is disposed between the cover and the stretchable sensing unit.

7. The electronic device according to claim 4, wherein the stretchable sensing unit comprises a first alignment mark, and the stretchable display unit comprises a second alignment mark corresponding to the first alignment mark.

* * * * *